US011482550B2

(12) United States Patent
Machida

(10) Patent No.: US 11,482,550 B2
(45) Date of Patent: Oct. 25, 2022

(54) IMAGING DEVICE AND ELECTRONIC APPARATUS

(71) Applicant: SONY SEMICONDUCTOR SOLUTIONS CORPORATION, Kanagawa (JP)

(72) Inventor: Takashi Machida, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/261,059

(22) PCT Filed: Jul. 19, 2019

(86) PCT No.: PCT/JP2019/028494
§ 371 (c)(1),
(2) Date: Jan. 18, 2021

(87) PCT Pub. No.: WO2020/026856
PCT Pub. Date: Feb. 6, 2020

(65) Prior Publication Data
US 2021/0320135 A1 Oct. 14, 2021

(30) Foreign Application Priority Data
Jul. 31, 2018 (JP) .............................. JP2018-143491

(51) Int. Cl.
H01L 27/146 (2006.01)
H04N 5/351 (2011.01)
H04N 5/374 (2011.01)

(52) U.S. Cl.
CPC .... H01L 27/14614 (2013.01); H01L 27/1464 (2013.01); H04N 5/351 (2013.01); H04N 5/374 (2013.01)

(58) Field of Classification Search
CPC ...... H04N 5/2253; H04N 5/351; H04N 5/374; H01L 27/14603; H01L 27/14612;
(Continued)

(56) References Cited

U.S. PATENT DOCUMENTS

2015/0069471 A1 3/2015 Kawamura
2016/0020237 A1 1/2016 Yamakawa
(Continued)

FOREIGN PATENT DOCUMENTS

EP 3618116 A 3/2020
EP 3618116 A1 3/2020
(Continued)

OTHER PUBLICATIONS

International Search Report prepared by the Japan Patent Office dated Sep. 25, 2019, for International Application No. PCT/JP2019/028494.

Primary Examiner — Lin Ye
Assistant Examiner — Chriss S Yoder, III
(74) Attorney, Agent, or Firm — Sheridan Ross P.C.

(57) ABSTRACT

An imaging device that smoothly transfers electric charges from a photoelectric converter to a transfer destination is provided. This imaging device includes: a semiconductor layer; a photoelectric converter that generates electric charges corresponding to a received light amount; and a transfer section that includes a first trench gate and a second trench gate and transfers the electric charges from the photoelectric converter to a single transfer destination via the first trench gate and the second trench gate, the first trench gate and the second trench gate each extending from the front surface to the back surface of the semiconductor layer into the photoelectric converter. The first trench gate has a first length from the front surface to the photoelectric converter, and the second trench gate has a second length
(Continued)

from the front surface to the photoelectric converter, the second length being shorter than the first length.

19 Claims, 27 Drawing Sheets

(58) Field of Classification Search
CPC ......... H01L 27/14614; H01L 27/14638; H01L 27/1464; H01L 27/14643; H01L 27/14689
See application file for complete search history.

(56) References Cited

U.S. PATENT DOCUMENTS

| | | |
|---|---|---|
| 2016/0049429 A1 | 2/2016 | Lee et al. |
| 2016/0218138 A1 | 7/2016 | Oishi |
| 2016/0268322 A1 | 9/2016 | Watanabe et al. |
| 2018/0213174 A1 | 7/2018 | Sano |
| 2020/0135781 A1* | 4/2020 | Nakagawa ........ H01L 27/14603 |

FOREIGN PATENT DOCUMENTS

| | | | |
|---|---|---|---|
| JP | 2015-053411 | 3/2015 | |
| JP | 2015-082592 | 4/2015 | |
| JP | 2016-136584 | 7/2016 | |
| WO | WO 2017/183477 | 10/2017 | |
| WO | WO 2018/198486 | 11/2018 | |
| WO | WO-2018198486 A1 * | 11/2018 | ........... H01L 27/146 |

* cited by examiner

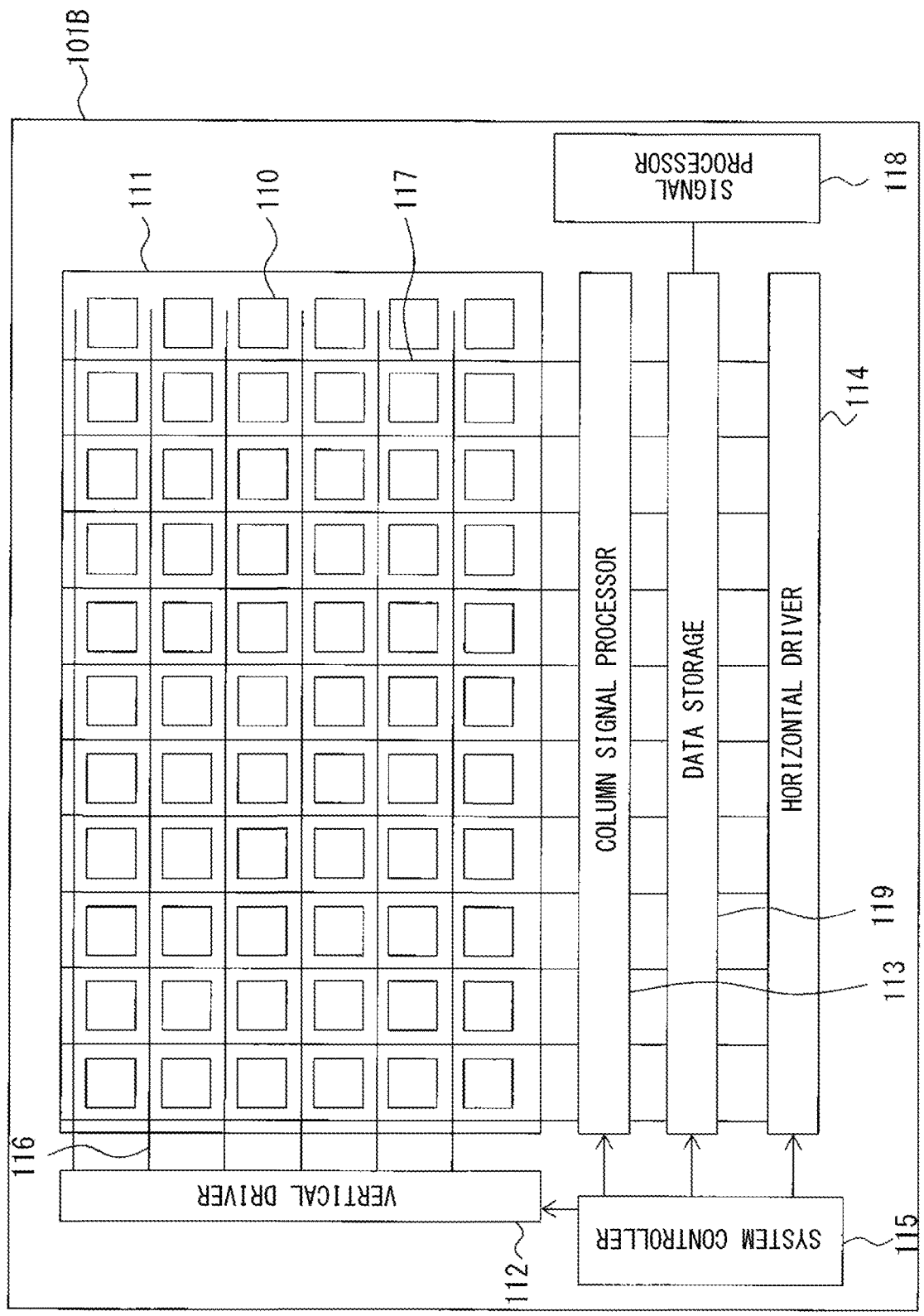

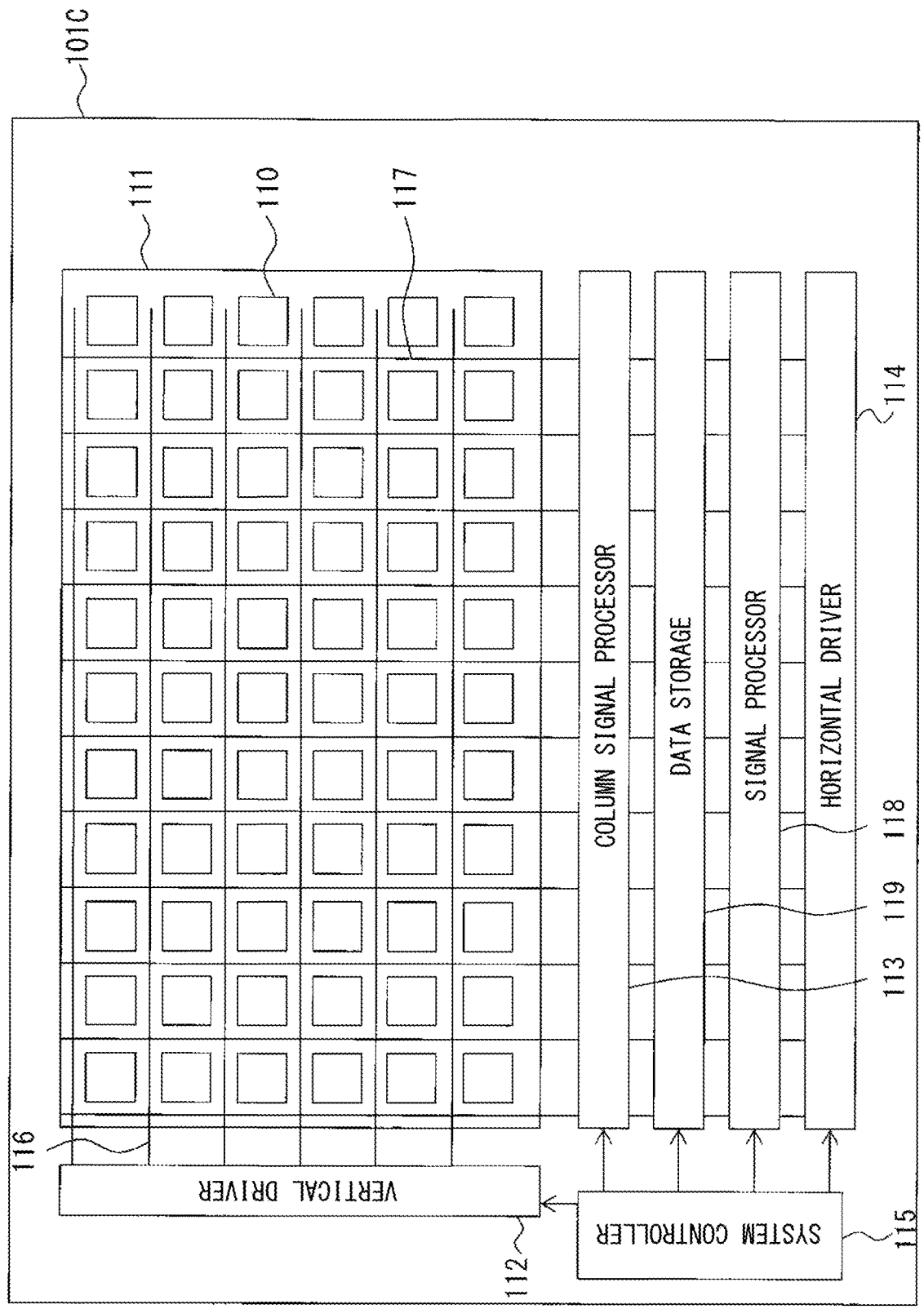

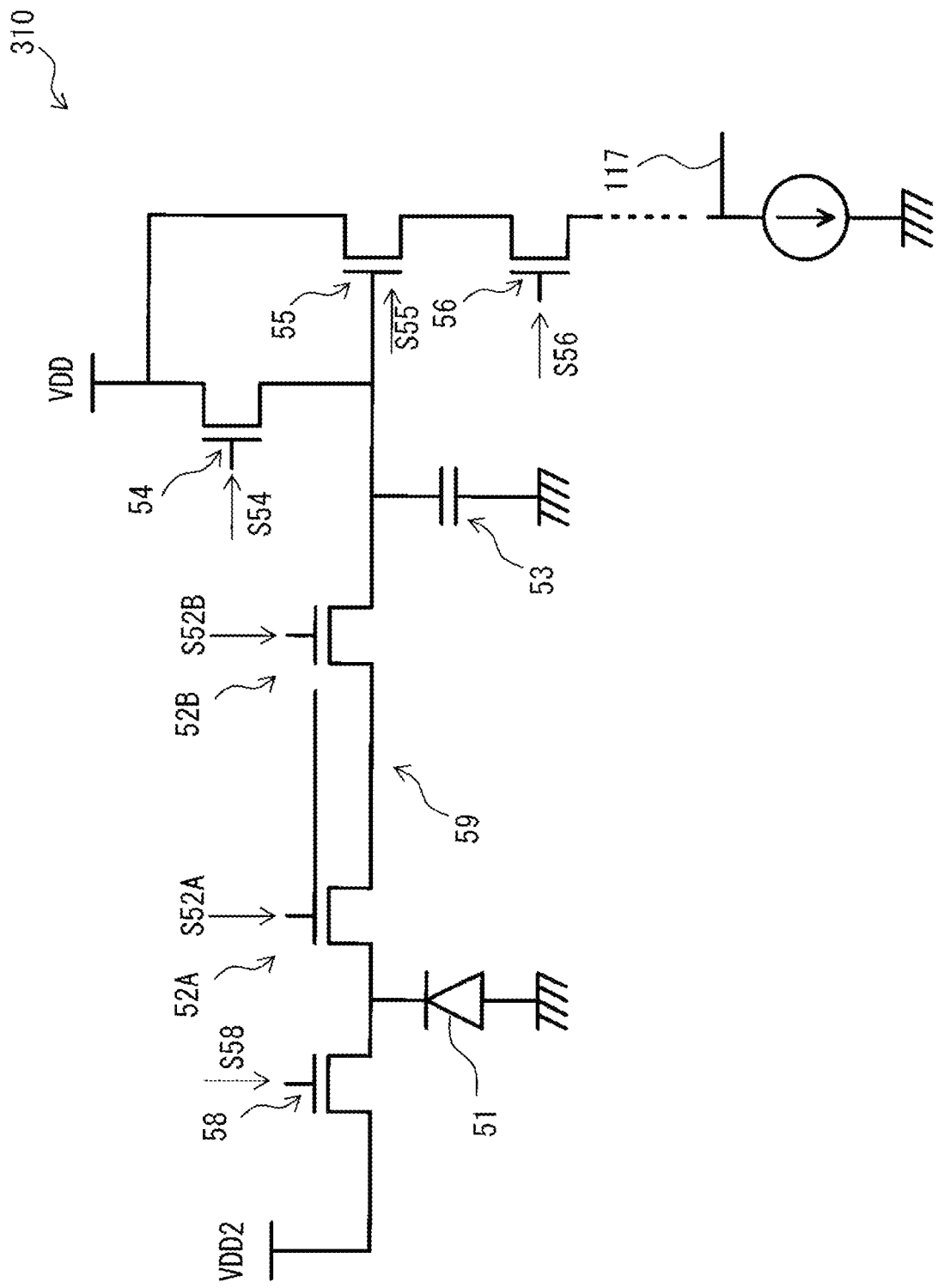

(A)

IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/028494 having an international filing date of Jul. 19, 2019, which designated the United States, which PCT application claimed the benefit of Japanese Patent Application No. 2018-143491, filed Jul. 31, 2018, the entire disclosures of each of which are incorporated herein by reference.

TECHNICAL FIELD

The present disclosure relates to an imaging device that performs imaging by performing photoelectric conversion, and an electronic apparatus including the imaging device.

BACKGROUND ART

There has been proposed a solid-state imaging device in which signal charges to be generated in a photoelectric converter provided in a semiconductor layer are transferred to a floating diffusion by a gate electrode embedded in the semiconductor layer (e.g., see PTL 1).

CITATION LIST

Patent Literature

PTL 1: Japanese Unexamined Patent Application Publication No. 2013-84785

SUMMARY OF THE INVENTION

Incidentally, in such a solid-state imaging device, it is desirable that electric charges be smoothly transferred from the photoelectric converter to a transfer destination.

Accordingly, it is desirable to provide an imaging device having excellent operation reliability and an electronic apparatus including such an imaging device.

An imaging device according to an embodiment of the present disclosure includes: a semiconductor layer having a front surface and a back surface, the back surface being on an opposite side of the front surface; a photoelectric converter that is embedded in the semiconductor layer and generates electric charges corresponding to a received light amount; and a transfer section that includes a first trench gate and a second trench gate and transfers the electric charges from the photoelectric converter to a single transfer destination via the first trench gate and the second trench gate, the first trench gate and the second trench gate each extending from the front surface to the back surface of the semiconductor layer into the photoelectric converter. The first trench gate has a first length from the front surface to the photoelectric converter, and the second trench gate has a second length from the front surface to the photoelectric converter, the second length being shorter than the first length.

Further, an electronic apparatus according to an embodiment of the present disclosure includes the above-described imaging device.

In the imaging device and the electronic apparatus according to the embodiments of the present disclosure each having such a configuration as described above, even if there is a potential dip in the photoelectric converter when the transfer section is in an off state, the potential dip is eliminated when the transfer section is in an on state.

According to the imaging device and the electronic apparatus of the embodiments of the present disclosure, electric charges are smoothly transferred from the photoelectric converter to the transfer destination, and it is possible to achieve excellent imaging performance.

It is to be noted that effects of the present disclosure are not limited to the above and may include any of effects described below.

BRIEF DESCRIPTION OF DRAWINGS

FIG. 1B is a block diagram illustrating a configuration example of a function of an imaging device according to a first modification example of the first embodiment.

FIG. 1C is a block diagram illustrating a configuration example of a function of an imaging device according to a second modification example of the first embodiment.

FIG. 10B is a circuit diagram illustrating a circuit configuration of the sensor pixel illustrated in FIG. 10A.

MODES FOR CARRYING OUT THE INVENTION

The following describes embodiments of the present disclosure in detail with reference to the drawings. It is to be noted that description is given in the following order.
1. First Embodiment
An example of a solid-state imaging device in which one vertical transistor in a transfer section includes two trench gates having different depths.
2. Modification Examples of First Embodiment 3. Second Embodiment An example of a solid-state imaging device further including: a power source serving as a transfer destination of electric charges; and a discharge transistor.
4. Third Embodiment
An example of a solid-state imaging device further including an electric charge holding section.
5. Fourth Embodiment
An example of a solid-state imaging device in which a transfer section includes two vertical transistors configured to be driven independently of each other.
6. Modification Example of Fourth Embodiment
7. Example of Application to Electronic Apparatus
8. Example of Practical Application to Mobile Body
9. Example of Practical Application to Endoscopic Surgery System
10. Other Modification Examples

1. First Embodiment

[Configuration of Solid-State Imaging Device 101A]

Figure 1A:
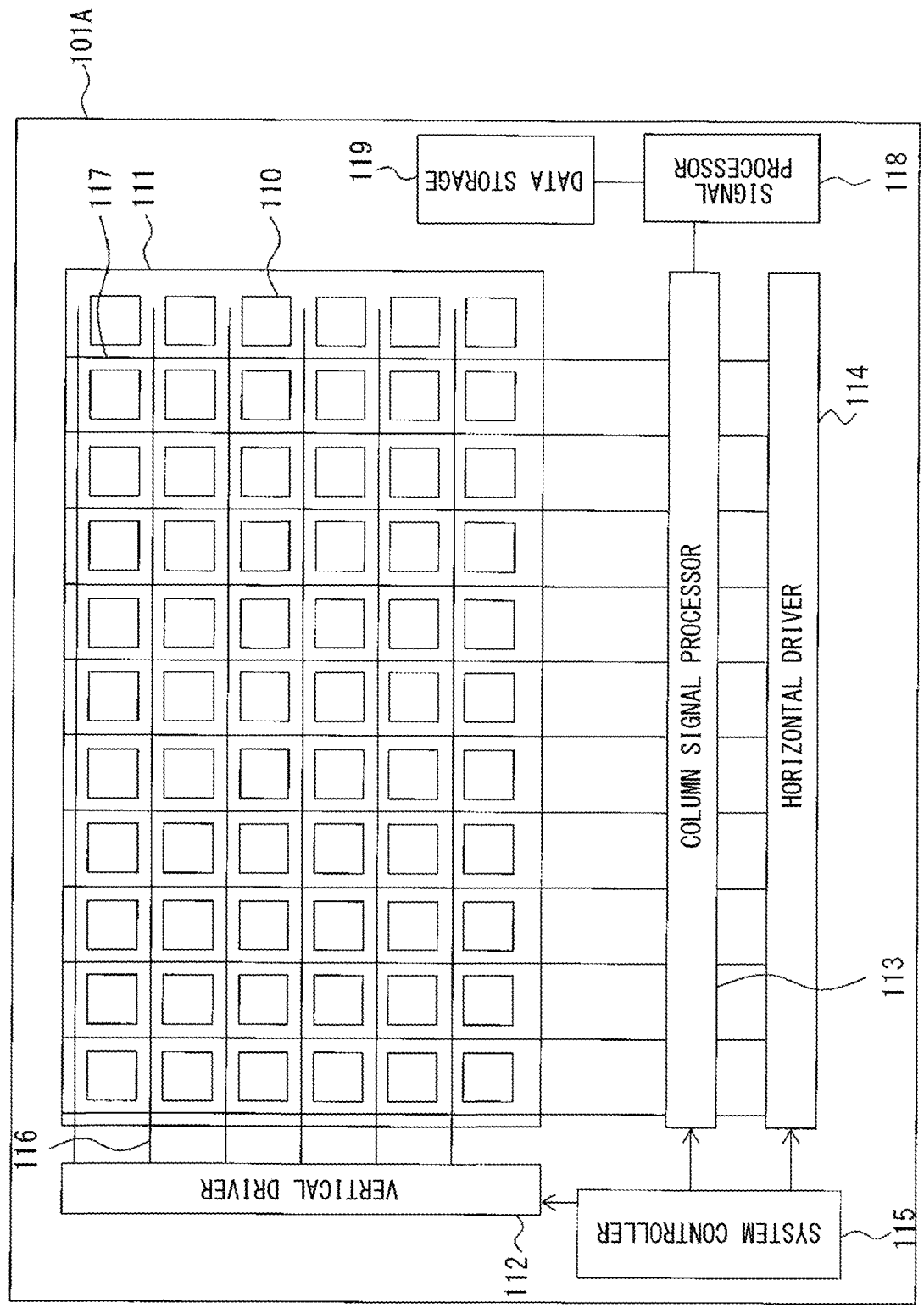
FIG. 1A is a block diagram illustrating a configuration example of a function of an imaging device according to a first embodiment of the present disclosure.

FIG. 1A is a block diagram illustrating a configuration example of a function of a solid-state imaging device 101A according to a first embodiment of the present technology.

The solid-state imaging device 101A is a so-called global shutter mode backside illumination image sensor such as, for example, a CMOS (Complementary Metal Oxide Semiconductor) image sensor. The solid-state imaging device 101A receives light from a subject, photoelectrically converts the light, and generates image signals to capture an image.

The global shutter mode is basically a mode in which global exposure is performed in which exposure is started at the same time for all pixels and exposure is terminated at the same time for all pixels. Here, the all pixels mean all of the pixels of a portion appearing in the image, and dummy pixels and the like are excluded. Further, if time difference or image distortion is sufficiently small to the extent that it does not pose an issue, a mode of moving an area for performing the global exposure while performing the global exposure in units of multiple rows (e.g., several tens of rows) rather than all pixels simultaneously is also included in the global shutter mode. In addition, a mode of performing the global exposure for pixels in a predetermined area, rather than all of the pixels of the portion appearing in the image, is also included in the global shutter mode.

The backside illumination image sensor refers to an image sensor having a configuration in which a photoelectric converter such as a photodiode that receives light from the subject and converts the light into an electric signal is provided between: a light receiving surface into which the light from the subject enters; and a wiring layer provided with a wiring line such as a transistor that drives each pixel or the like.

The solid-state imaging device 101A includes, for example, a pixel array 111, a vertical driver 112, a column signal processor 113, a data storage 119, a horizontal driver 114, a system controller 115, and a signal processor 118.

The solid-state imaging device 101A has the pixel array 111 formed on a semiconductor layer 11 (to be described later). Peripheral circuits such as the vertical driver 112, the column signal processor 113, the data storage 119, the horizontal driver 114, the system controller 115, and the signal processor 118 are formed on the semiconductor layer 11 on which the pixel array 111 is formed, for example.

The pixel array 111 has a plurality of sensor pixels 110 each including a photoelectric converter 51 (to be described later) that generates electric charges corresponding to an amount of light entered from a subject and accumulates the electric charges. As illustrated in FIG. 1, the sensor pixels 110 are arranged in a horizontal direction (row direction) and in a vertical direction (column direction). In the pixel array 111, a pixel drive line 116 is wired along the row direction for each pixel row including sensor pixels 110 arranged in line in the row direction, and a vertical signal line (VSL) 117 is wired along the column direction for each pixel column including sensor pixels 110 arranged in line in the column direction.

The vertical driver 112 includes a shift register, an address decoder, and the like. The vertical driver 112 simultaneously drives all of the plurality of sensor pixels 110 in the pixel array 111 or drives them in pixel row units by supplying signals or the like to the plurality of sensor pixels 110 via the respective plurality of pixel drive lines 116.

The vertical driver 112 includes two scanning systems, e.g., a readout scanning system and a sweep scanning system. The readout scanning system selects and scans the unit pixels of the pixel array 111 in rows in order to read out signals from the unit pixels. The sweep scanning system performs, on a readout row on which readout scanning is to be performed by the readout scanning system, sweep scanning in advance of the readout scanning by time of a shutter speed.

Owing to the sweep scanning performed by the sweep scanning system, unnecessary electric charges are swept out from the photoelectric converter 51 of the unit pixels of the readout row. This is called reset. Then, owing to the sweeping out of the unnecessary electric charges by the sweeping scanning system, that is, resetting, a so-called electronic shutter operation is performed. Here, the electronic shutter operation refers to an operation in which optical charges of the photoelectric converter 51 are discharged and the exposure is newly started, that is, accumulation of the optical charges is newly started.

Signals to be read out by a readout operation by the readout scanning system corresponds to an amount of light that has entered after the immediately previous readout operation or electronic shutter operation. An accumulation time of the optical charges in the unit pixels, i.e., an exposure time, is a period from a timing of the reading out of the immediately previous readout operation or a timing of the sweeping out of the immediately previous electronic shutter operation to a timing of the reading out of the current readout operation.

The signal to be outputted from each unit pixel of the pixel row selected and scanned by the vertical driver 112 is supplied to the column signal processor 113 through one of the vertical signal lines 117. The column signal processor 113 performs a predetermined signal process on the signal outputted from each unit pixel of the selected row through the vertical signal line 117 for each pixel column of the pixel array 111, and temporarily holds the pixel signal that has been subjected to the signal process.

Specifically, the column signal processor 113 includes, for example, a shift register or an address decoder, and performs a noise elimination process, a correlation double sampling process, an A/D (Analog/Digital) conversion A/D conversion process on analog pixel signals, etc., to generate digital pixel signals. The column signal processor 113 supplies the generated pixel signals to the signal processor 118.

The horizontal driver 114 includes a shift register, an address decoder, and the like, and sequentially selects unit circuits corresponding to the pixel columns of the column signal processor 113. Owing to the selection scanning by the horizontal driver 114, the pixel signals processed for each unit circuit in the column signal processor 113 are sequentially outputted to the signal processor 118.

The system controller 115 includes a timing generator or the like which generates various timing signals. The system controller 115 controls driving of the vertical driver 112, the column signal processor 113, and the horizontal driver 114 on the basis of the timing signals generated by the timing generator.

The signal processor 118 performs, while temporarily storing data in the data storage 119 as necessary, a signal process such as an arithmetic process on the pixel signals supplied from the column signal processor 113, and outputs image signals including the respective pixel signals.

The data storage 119 temporarily stores data necessary for the signal process for when the signal process is to be performed in the signal processor 118.

It is to be noted that the solid-state imaging device according to the present technology is not limited to the solid-state imaging device 101A illustrated in FIG. 1A, and may have a configuration such as a solid-state imaging device 101B illustrated in FIG. 1B or a solid-state imaging device 101C illustrated in FIG. 1C, for example. FIG. 1B is a block diagram illustrating a configuration example of a function of the solid-state imaging device 101B according to a first modification example of the first embodiment of the present technology. FIG. 1C is a block diagram illustrating a configuration example of a function of the solid-state imaging device 101C according to a second modification example of the first embodiment of the present technology.

The solid-state imaging device 101B illustrated in FIG. 1B has the data storage 119 disposed between the column signal processor 113 and the horizontal driver 114, and the pixel signals outputted from the column signal processor 113 are supplied to the signal processor 118 via the data storage 119.

Further, the solid-state imaging device 101C illustrated in FIG. 1C has the data storage 119 and the signal processor 118 disposed in parallel between the column signal processor 113 and the horizontal driver 114. In the solid-state imaging device 101C, the column signal processor 113 performs the A/D conversion for converting analog pixel signals into digital pixel signals for each column of the pixel array 111 or for every multiple columns of the pixel array 111.

[Configuration of Sensor Pixel 110]
(Circuit Configuration Example)

Figure 2:
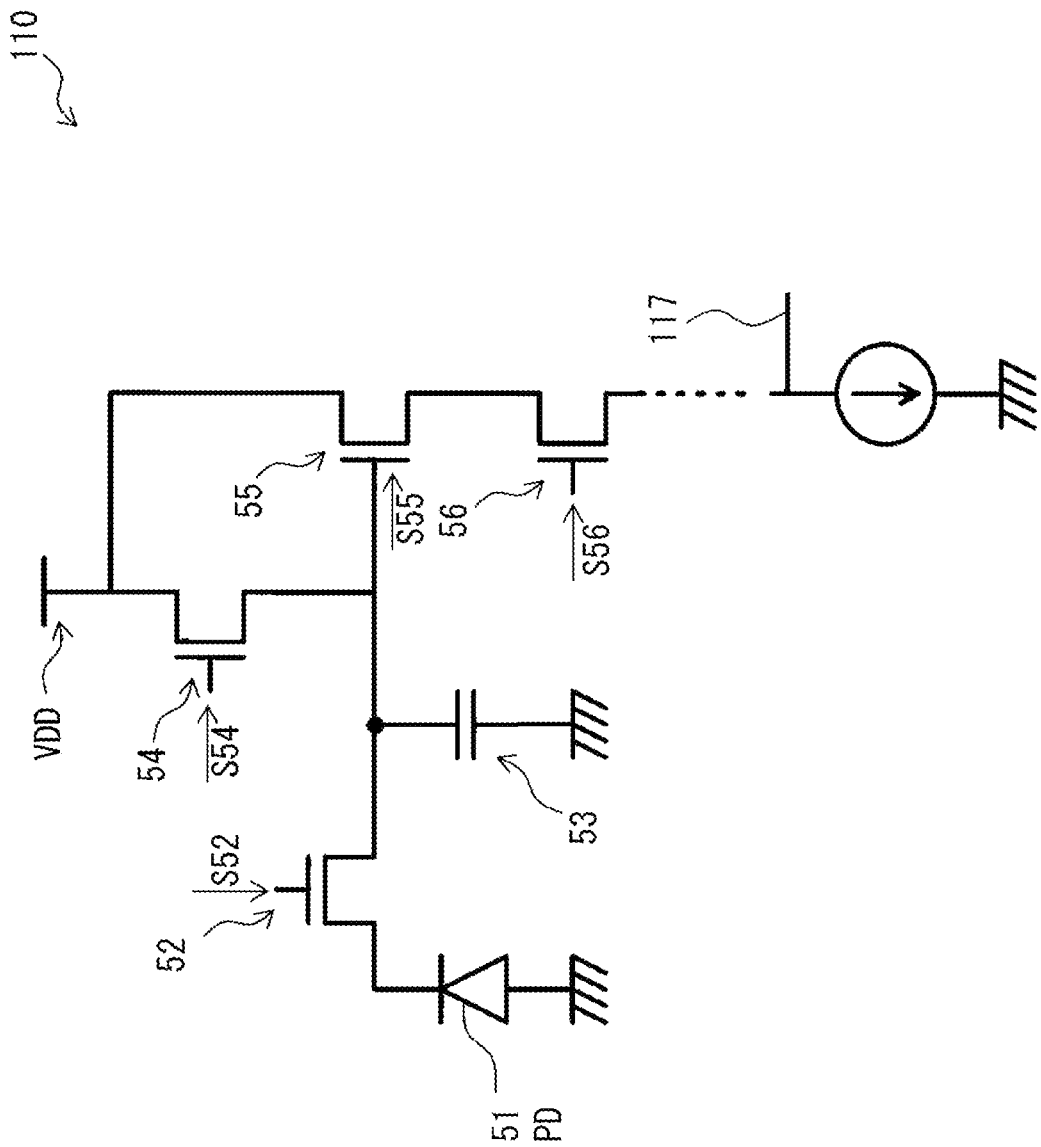
FIG. 2 is a circuit diagram illustrating a circuit configuration of one sensor pixel included in the imaging device illustrated in FIG. 1A.

Next, referring to FIG. 2, a circuit configuration example of the sensor pixel 110 provided in the pixel array 111 of FIG. 1A will be described. FIG. 2 is a circuit configuration example of one sensor pixel 110 out of the plurality of sensor pixels 110 included in the pixel array 111.

In the example illustrated in FIG. 2, the sensor pixel 110 in the pixel array 111 includes a photoelectric converter (PD) 51, a transfer transistor (TG) 52, an electric charge-voltage converter (FD) 53, a reset transistor (RST) 54, an amplifier transistor (AMP) 55, and a select transistor (SEL) 56.

In this example, the TG 52, the RST 54, the AMP 55, and the SEL 56 are each an N-type MOS transistor. A gate electrode of the TG 52, a gate electrode of the RST 54, a gate electrode of the AMP 55, and a gate electrode of the SEL 56 are supplied with drive signals S52, S54, and S56, respectively, by the vertical driver 112 and the horizontal driver 114 on the basis of the drive control of the system controller 115. The drive signals S52, S54, and S56 are each a pulse signal in which a high level state is an active state (on state) and a low level state is an inactive state (off state). It is to be noted that, in the following, turning the drive signal into the active state is also referred to turning on the drive signal, and turning the drive signal into the inactive state is also referred to as turning off the drive signal.

The PD 51 is, for example, a photoelectric conversion element including a photodiode of a PN-junction, and is configured to receive light from a subject, generate electric charges corresponding to the received light amount by the photoelectric conversion, and accumulate the electric charges.

The TG 52 is coupled between the PD 51 and the FD 53, and is configured to transfer the electric charges accumulated in the PD 51 to the FD 53 in response to the drive signal S52 applied to the gate electrode of the TG 52. The TG 52 is a specific example corresponding to "transfer section" of the present disclosure.

The RST 54 has a drain coupled to a power source VDD and a source coupled to the FD 53. The RST 54 initializes or resets the FD 53 in response to the drive signal S54 applied to the gate electrode of the RST 54. For example, when the drive signal S58 is turned on and the RST 58 is turned on, a potential of the FD 53 is reset to a voltage level of the power source VDD. That is, the FD 53 is initialized.

The FD 53 is a floating diffusion region which converts the electric charges transferred from the PD 51 via the TG 52 into electric signals (e.g., voltage signals) and outputs the electric signals. The RST 54 is coupled to the FD 53, and the vertical signal line VSL is also coupled to the FD 53 via the AMP 55 and the SEL 56.

(Plane Configuration Example and Cross-Sectional Configuration Example)

Figure 3:
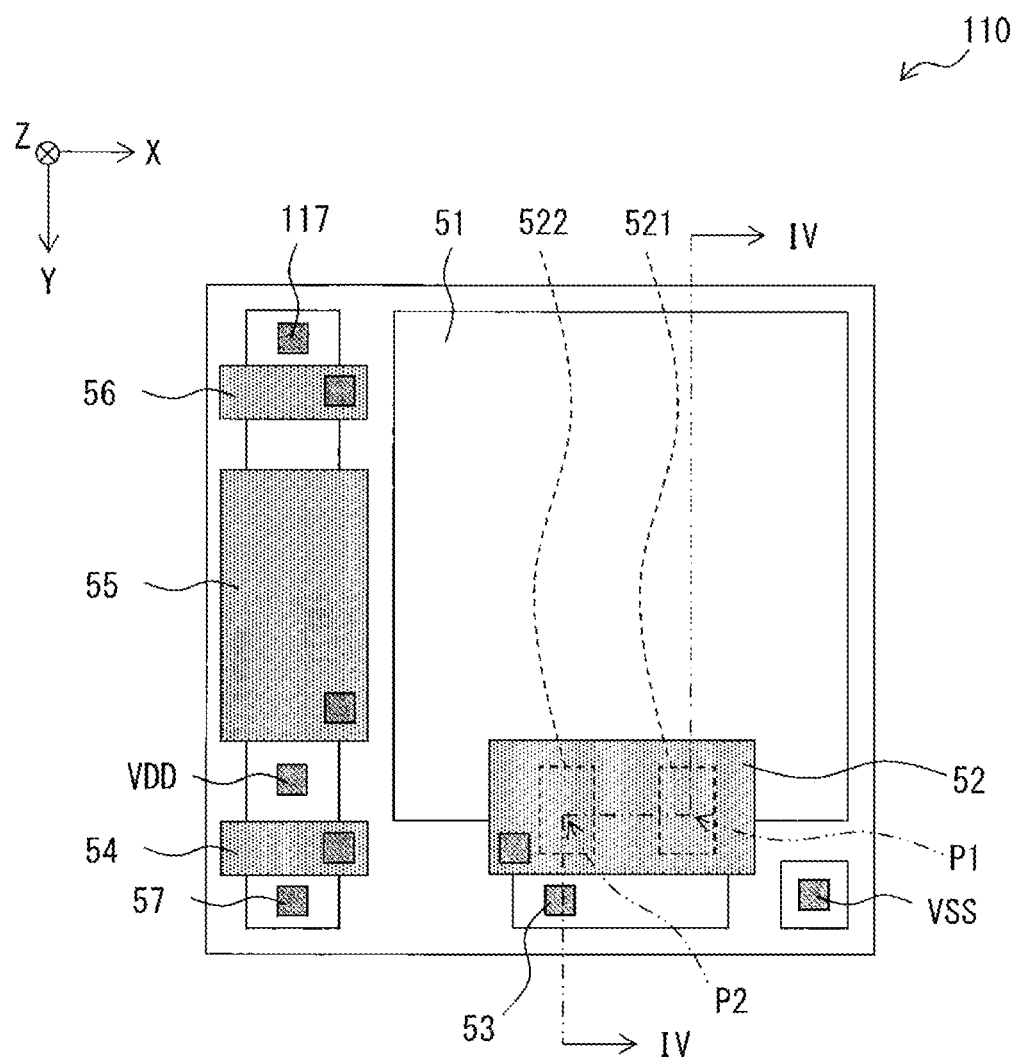
FIG. 3 is a schematic plan view of a configuration of a portion of the sensor pixel included in the imaging device illustrated in FIG. 1A.
Figure 4:
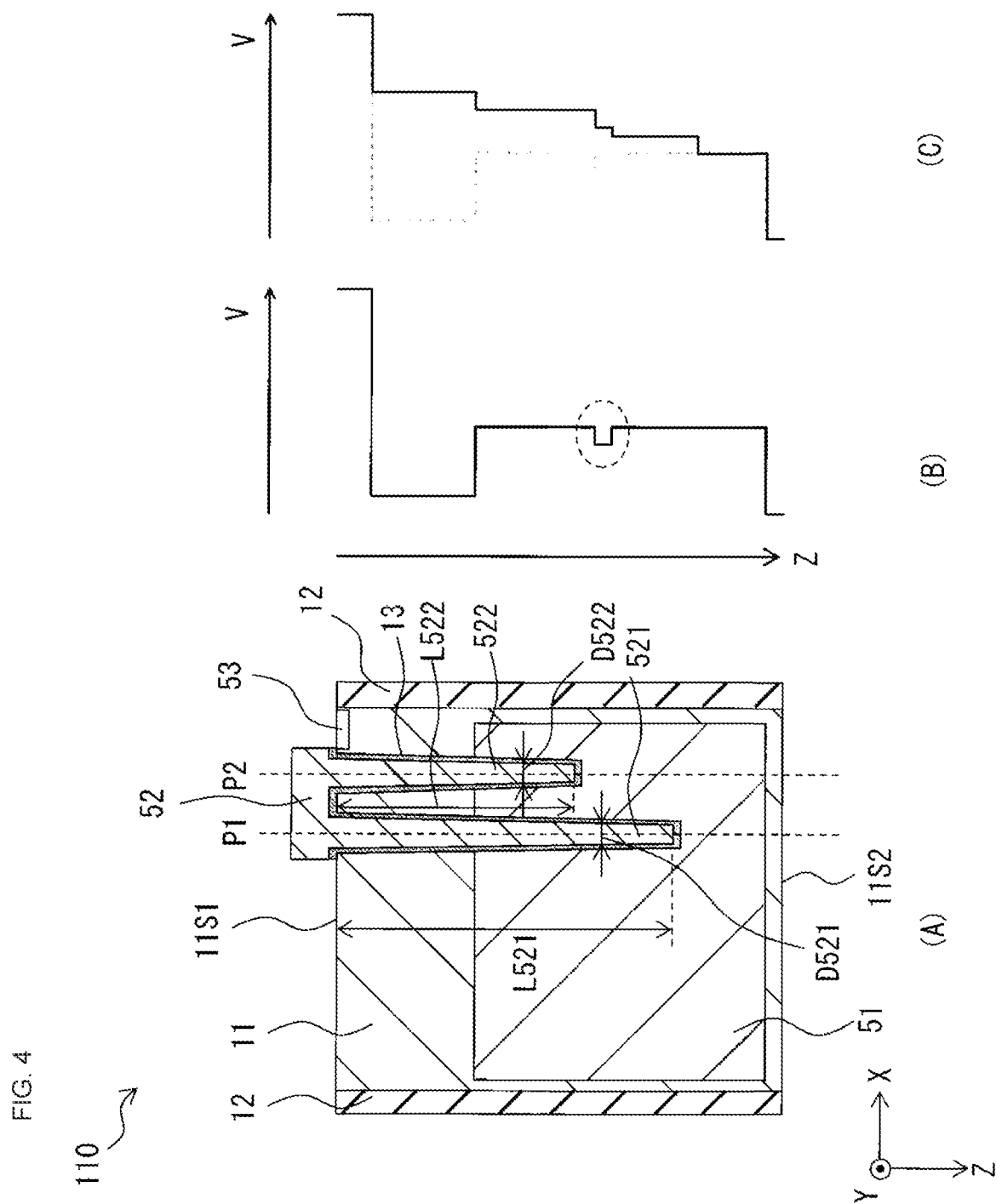
FIG. 4 is a schematic cross-sectional view of a configuration of a portion of the sensor pixel included in the imaging device illustrated in FIG. 1A, and schematic views of potential states in a depth direction.

Next, with reference to FIG. 3 and FIG. 4, a plane configuration example and a cross-sectional configuration example of the sensor pixel 110 provided in the pixel array 111 of FIG. 1A will be described. FIG. 3 illustrates a plane configuration example of one sensor pixel 110 out of the plurality of sensor pixels 110 included in the pixel array 111. FIG. 4 (A) illustrates a cross-sectional configuration example of one sensor pixel 110, which corresponds to a cross-section of an arrow direction taken along a line IV-IV illustrated in FIG. 3. However, in FIG. 4 (A), a portion between a position P1 and a position P2 indicates an XZ cross-section along an X-axis direction, otherwise indicates a YZ cross-section along a Y-axis direction.

In the examples illustrated in FIG. 3 and FIG. 4 (A), the PD 51 occupies a central region of the sensor pixel 110, and the RST 54, the VDD, the AMP 55, the SEL 56, an FD 57, a VSS, and the VSL 117 are provided in a peripheral region thereof. The TG 52 and the FD 53 are each provided at a position overlapping with the PD 51 in a Z-axis direction (also referred to as thickness direction or depth direction). The FD 57 is coupled to the FD 53 through a metal layer. The VSS is a ground terminal, and is normally set to 0 V.

As illustrated in FIG. 3 and FIG. 4 (A), the sensor pixel 110 includes: the semiconductor layer 11 including a semiconductor material such as Si (silicon); the PD 51, and the TG 52 serving as the transfer section. Further, an insulating layer 13 including an oxide or the like is provided between: the TG 52; and the semiconductor layer 11 and the PD 51. The semiconductor layer 11 includes: a front surface 11S1; and a back surface 11S2 that is on an opposite side of the front surface 11S1. The semiconductor layer 11 may be provided with a light-shielding section 12 so as to surround the PD 51.

The TG 52 includes a trench gate 521 and a trench gate 522. The TG 52 is adapted to transfer, from the PD 51 via the trench gate 521 and the trench gate 522, electric charges generated and accumulated in the PD 51 to an identical transfer destination, i.e., the FD 53. As illustrated in FIG. 4 (A), the trench gate 521 and the trench gate 522 each extend from the front surface 11S1 to the back surface 11S2 of the semiconductor layer 11 into the PD 51.

The trench gate 521 has a length L521 from the front surface 11S1 to the PD 51. The trench gate 522 has a length L522, which is shorter than the length L521, from the front surface 11S1 to the PD 51 (L521>L522).

In addition, a diameter D521 of the trench gate 521 and a diameter D522 of the trench gate 522 are each narrowed toward the back surface 11S2 from the front surface 11S1. Further, a maximum value of the diameter D521 of the trench gate 521 is larger than a maximum value of the diameter D522 of the trench gate 522. It is to be noted that, in the example illustrated in FIG. 4 (A), the diameter D521 of the trench gate 521 and the diameter D522 of the trench gate 522 are both maximized at the uppermost portions.

(Operation of Sensor Pixel 110)

Next, referring to FIG. 4 (B) and FIG. 4 (C) in addition to FIG. 2 and FIG. 4 (A), an operation of the sensor pixel 110 will be described. In the sensor pixel 110, the drive signal S52 to the TG 52 is turned on on the basis of the drive control of the system controller 115 when the electric charges generated and accumulated in the PD 51 that has received the light from the subject is read out. This causes the accumulated electric charges to be transferred from the PD 51 to the FD 53 via the trench gate 521 and the trench gate 522. It is to be noted that, a potential in the depth direction (Z-axis direction) in the PD 51 has a gradient such as to gradually increase toward a shallower position, i.e., a position close to the front surface 11S1, from a deeper position, i.e., a position close to the back surface 11S2.

In reality, however, a potential dip may occur in a portion of the depth direction of the PD 51. The potential dip is a point that has a low potential compared to potentials immediately above and below itself. In particular, when enlarging a dimension of the PD 51 in the depth direction, a potential gradient in the depth direction becomes gradual, and the potential dip tends to occur easily. Here, if the TG 52 has only one trench gate 521, a potential state in the thickness direction (Z-axis direction) in the PD 51 is as indicated in FIG. 4 (B), for example. FIG. 4 (B) is a schematic view of a potential state in the depth direction (Z-axis direction) in the PD 51 in a case where it is assumed that the TG 52 has only one trench gate 521, and corresponds to the cross section of FIG. 4 (A). If the TG 52 has only one trench gate 521, in the PD 51, the potential dip (a portion surrounded by a broken line) may remain as it is in a portion of the depth, as indicated in FIG. 4 (B). Alternatively, it is also similar in a case where the TG 52 has the trench gate 521 and the trench gate 522 whose lengths are the same as each other.

In contrast, the sensor pixel 110 according to the present embodiment includes the TG 52 having a relatively long trench gate 521 and a relatively short trench gate 522. Accordingly, a modulation force that a potential of the PD 51 receives from the TG 52 increases when moving from a region in which only the trench gate 521 exists to a region in which both the trench gate 521 and the trench gate 522 exist. Consequently, the potential state in the thickness direction (Z-axis direction) in the PD 51 becomes a state indicated in FIG. 4 (C), for example, so that the potential dip present in the portion of the depth direction is eliminated. It is to be noted that FIG. 4 (C) is a schematic view of a potential state in the depth direction (Z-axis direction) in the PD 51, and corresponds to the cross section of FIG. 4 (A).

[Effects of Solid-State Imaging Device 101A]

As described above, in the solid-state imaging device 101A according to the present embodiment, the TG 52 that transfers the electric charges from the PD 51 has the trench gate 521 having the length L521 and the trench gate 522 having the length L522 shorter than the length L521. Accordingly, even if an unintended potential dip is present in the PD 51 in a state in which the TG 52 is off, or even if an unintended potential dip is generated in the PD 51 for increasing a saturated charge amount, it is possible to eliminate the potential dip in a state in which the TG 52 is on. Thus, even in a case where a thickness of the semiconductor layer 11 is increased, that is, even in a case where the gradient of the potential along the Z-axis direction becomes gradual, it is possible to smoothly transfer the electric charges from the PD 51 to the FD 53. This leads to an expectation of improvement in the operation reliability of the solid-state imaging device 101A.

Further, in the solid-state imaging device 101A according to the present embodiment, the diameter D521 of the trench gate 521 and the diameter D522 of the trench gate 522 are narrowed toward the back surface 11S2 from the front surface 11S1. Further, the maximum value of the diameter D521 of the trench gate 521 is larger than the maximum value of the diameter D522 of the trench gate 522. This provides an advantageous structure for accurately forming the trench gate 521 having the larger length L521 and the trench gate 522 having the length L522 shorter than the length L521.

2. Modification Examples of First Embodiment (Third Modification Example)
[Configuration of Sensor Pixel 110A]

Figure 5:
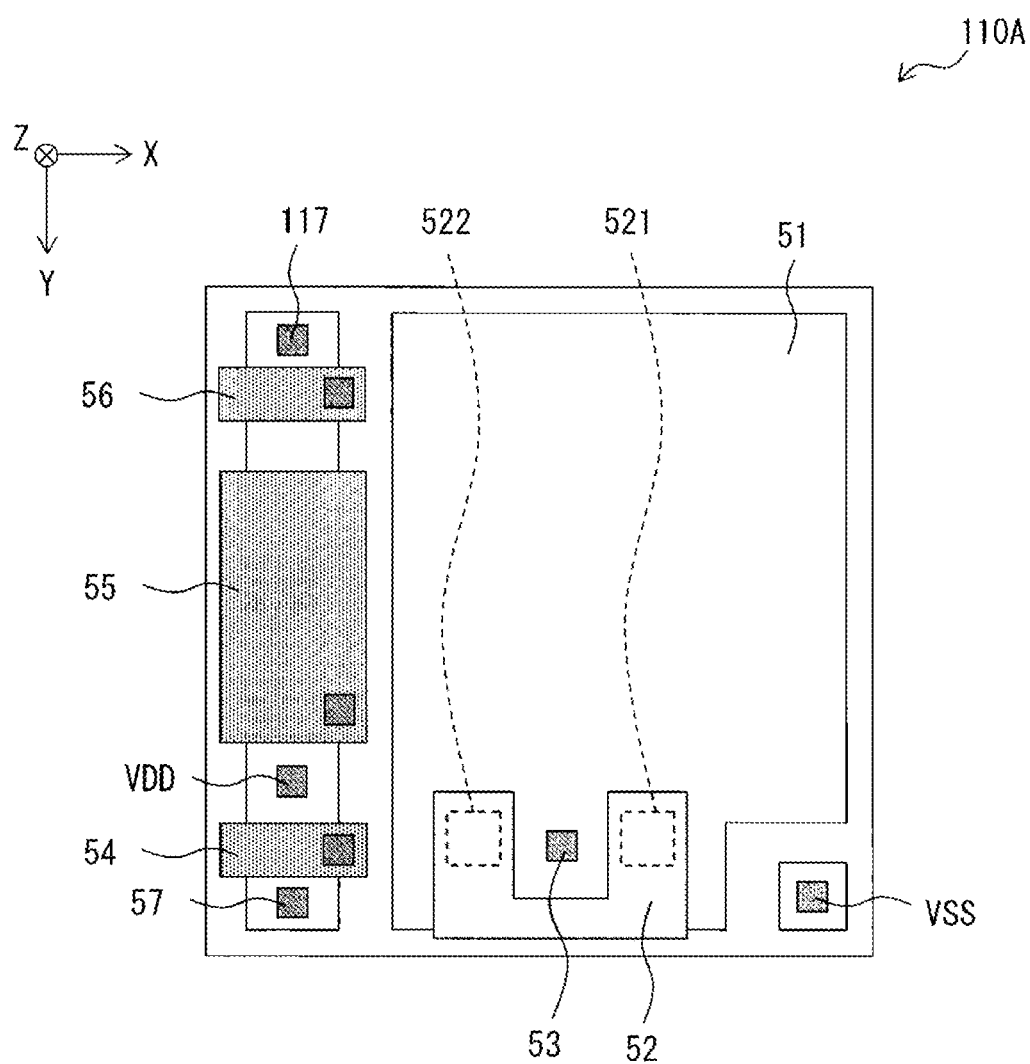
FIG. 5 is a plan view of a sensor pixel according to a third modification example of the first embodiment.

FIG. 5 is a plan view of a sensor pixel 110A according to a third modification example of the first embodiment. It is to be noted that FIG. 5 corresponds to FIG. 3 of the first embodiment.

As illustrated in FIG. 5, the sensor pixel 110A according to the present modification example is such that the FD 53, which is the transfer destination of the electric charges, is located between the trench gate 521 and the trench gate 522. Except for this point, the rest has substantially the same configuration as the sensor pixel 110 according to the first embodiment described above.

[Workings and Effects of Sensor Pixel 110A]

As described above, according to the sensor pixel 110A of the present modification example, the FD 53 serving as the transfer destination is disposed between the trench gate 521 and the trench gate 522 as compared with the sensor pixel 110 according to the above-described first embodiment. In a portion between the trench gate 521 and the trench gate 522, a back-bias effect is eliminated and the modulation force received from the TG 52 is the highest. Accordingly, the electric charges to be transferred inevitably pass between the trench gate 521 and the trench gate 522 to be transferred to the front surface 11S1. The presence of the FD 53, which is the transfer destination of the electric charges, in the vicinity of the front surface 11S enhances a transfer efficiency of the electric charges from the PD 51 to the FD 53.

(Fourth Modification Example)
[Configuration of Sensor Pixel 110B]

Figure 6:
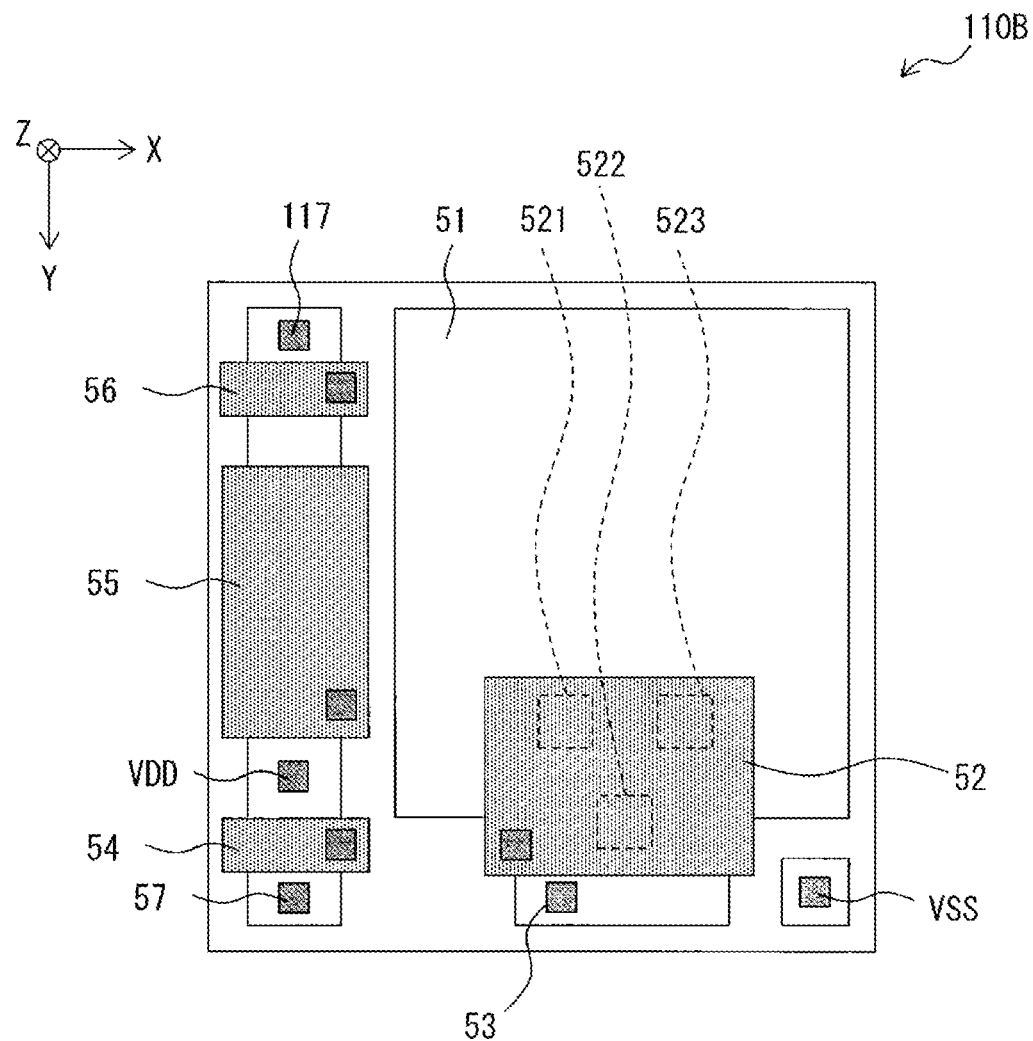
FIG. 6 is a plan view of a sensor pixel according to a fourth modification example of the first embodiment.

FIG. 6 is a plan view of a sensor pixel 110B according to a fourth modification example of the first embodiment. It is to be noted that FIG. 6 corresponds to FIG. 3 of the first embodiment.

As illustrated in FIG. 6, the sensor pixel 110B according to the present modification example is such that the TG 52 further includes a trench gate 523 serving as a third trench gate in addition to the trench gate 521 and the trench gate 522. Further, the trench gates 521 to 523 each have a cross-section along the XY plane of a substantially square shape. Still further, in the XY plane, a distance between the trench gate 522 and the FD 53, which is the transfer destination, is shorter than a distance between the trench gate 521 and the FD 53, and is shorter than a distance between the trench gate 523 and the FD 53. Except for these points, the rest has substantially the same configuration as the sensor pixel 110 according to the first embodiment described above.

[Workings and Effects of Sensor Pixel 110B]

As described above, according to the sensor pixel 110B of the present modification example, the trench gate 523 is further provided, and thus the number of trench gates is large compared to the sensor pixel 110. Therefore, it is possible to exert a modulation force also on a potential of a region at a position farther from the TG 52 in the horizontal plane (in the XY plane) of the PD 51. As a result, it is possible to more smoothly transfer the electric charges from the PD 51 to the FD 53.

(Fifth Modification Example)
[Configuration of Sensor Pixel 110C]

Figure 7:
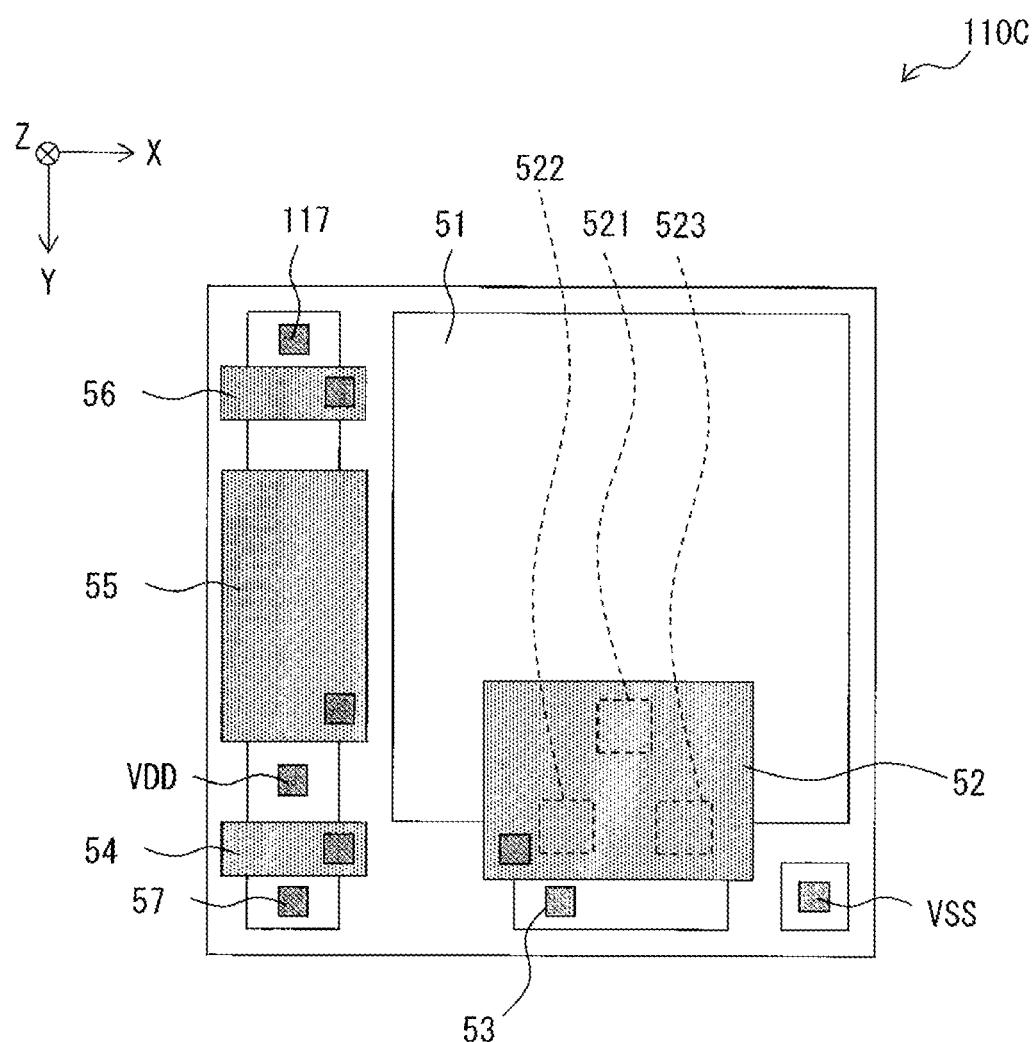
FIG. 7 is a plan view of a sensor pixel according to a fifth modification example of the first embodiment.

FIG. 7 is a plan view of a sensor pixel 110C according to a fifth modification example of the first embodiment. It is to be noted that FIG. 7 corresponds to FIG. 3 of the first embodiment.

As illustrated in FIG. 7, in the sensor pixel 110C according to the present modification example, the TG 52 further includes the trench gate 523 serving as the third trench gate in addition to the trench gate 521 and the trench gate 522. Further, the trench gates 521 to 523 each have a cross-section along the XY plane of a substantially square shape. Still further, in the XY plane, a distance between the trench gate 521 and the FD 53, which is the transfer destination, is longer than a distance between the trench gate 522 and the FD 53, and is longer than a distance between the trench gate 523 and the FD 53. Except for these points, the rest has substantially the same configuration as the sensor pixel 110 according to the first embodiment described above.

[Workings and Effects of Sensor Pixel 110C]

As described above, according to the sensor pixel 110C of the present modification example, the trench gate 523 is further provided, and thus the number of trench gates is large compared to the sensor pixel 110. Therefore, it is possible to exert a modulation force also on a potential of a region at a position farther from the TG 52 in the horizontal plane of the PD 51 (in the XY plane). As a result, it is possible to more smoothly transfer the electric charges from the PD 51 to the FD 53. Further, in the sensor pixel 110C according to the present modification example, two out of the three trench gates are disposed in the vicinity of the FD 53 which is the transfer destination of electric charges. This makes it possible to more efficiently transfer the electric charges of the PD 51 to the FD 53 as compared with the sensor pixel 110B according to the fourth modification example of the first embodiment illustrated in FIG. 6. This is because a favorable transfer path that allows more efficient transfer of the electric charges of the PD 51, i.e., a region portion between the trench gate 522 and the trench gate 523, is disposed in the vicinity of the FD 53.

(Sixth Modification Example)
[Configuration of Sensor Pixel 110D]

Figure 8:
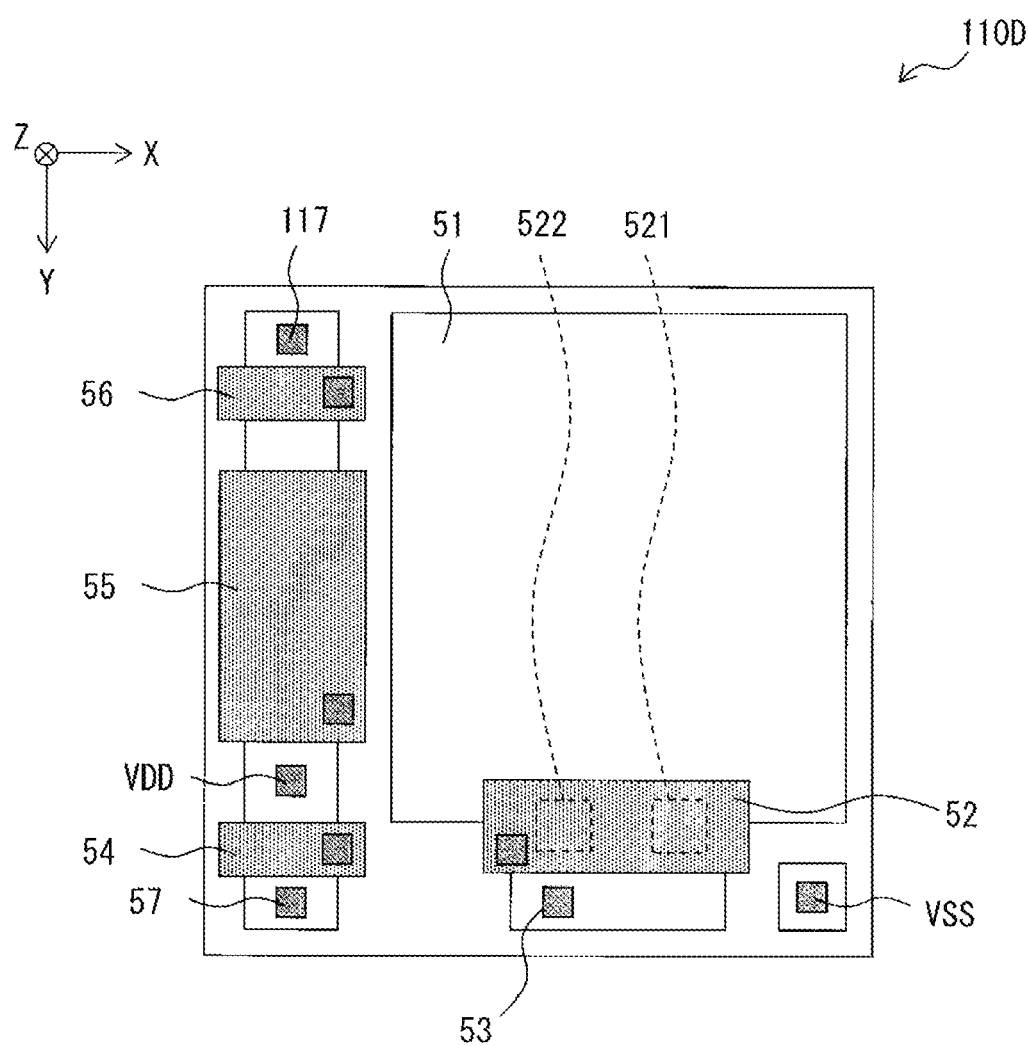
FIG. 8 is a plan view of a sensor pixel according to a sixth modification example of the first embodiment.

FIG. 8 is a plan view of a sensor pixel 110D according to a sixth modification example of the first embodiment. It is to be noted that FIG. 8 corresponds to FIG. 3 of the first embodiment.

As illustrated in FIG. 8, the sensor pixel 110D according to the present modification example has the trench gates 521 and 522 each having a cross-section along the XY plane of a substantially square shape. Except for this point, the rest has substantially the same configuration as the sensor pixel 110 according to the first embodiment described above.

[Workings and Effects of Sensor Pixel 110D]

As described above, according to the sensor pixel 110D of the present modification example, it is possible to decrease an area occupied by the TG 52 in the horizontal plane (in the XY plane) as compared with the sensor pixel 110 according to the first embodiment described above. Therefore, it is possible to increase a light-receivable area of the PD 51 in the horizontal plane (in the XY plane).

3. Second Embodiment

Figure 9A:
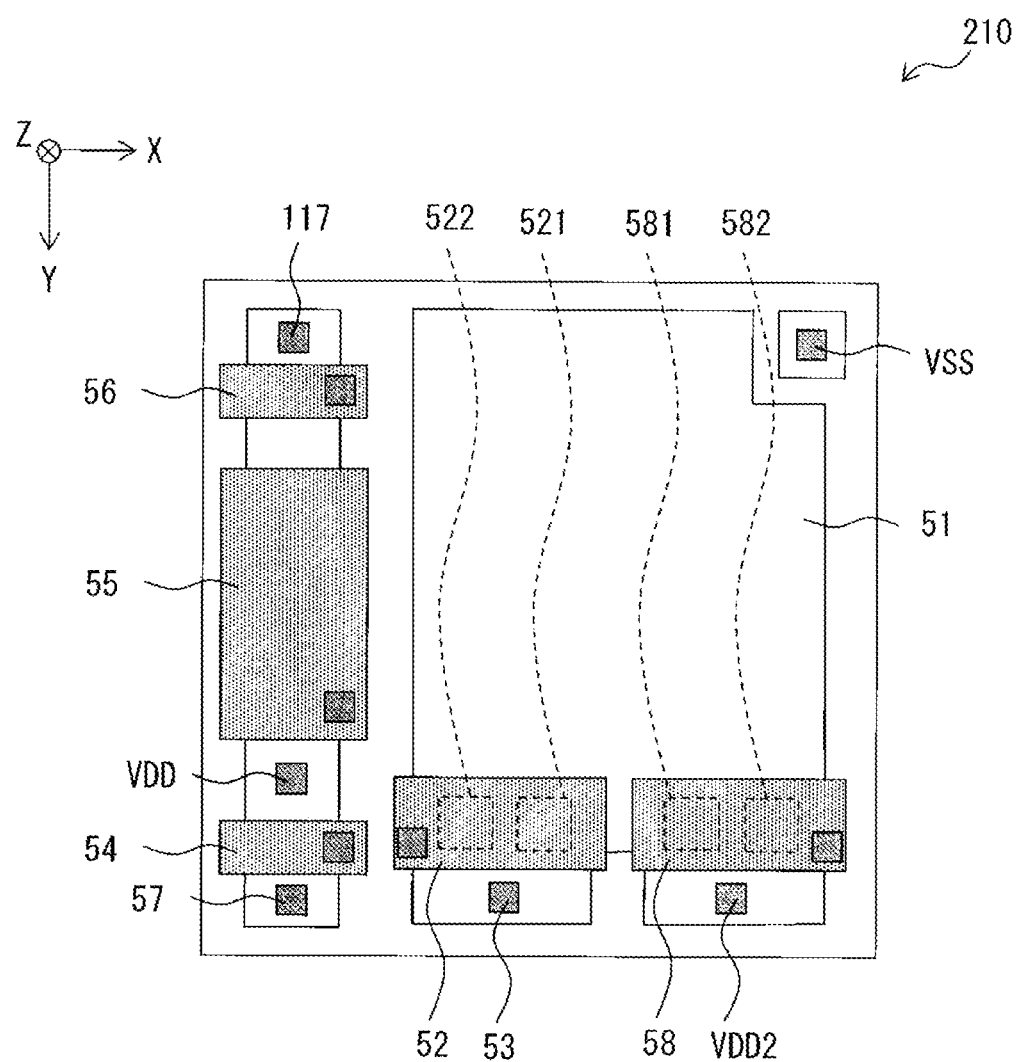
FIG. 9A is a plan view of a sensor pixel according to a second embodiment of the present disclosure.
Figure 9B:
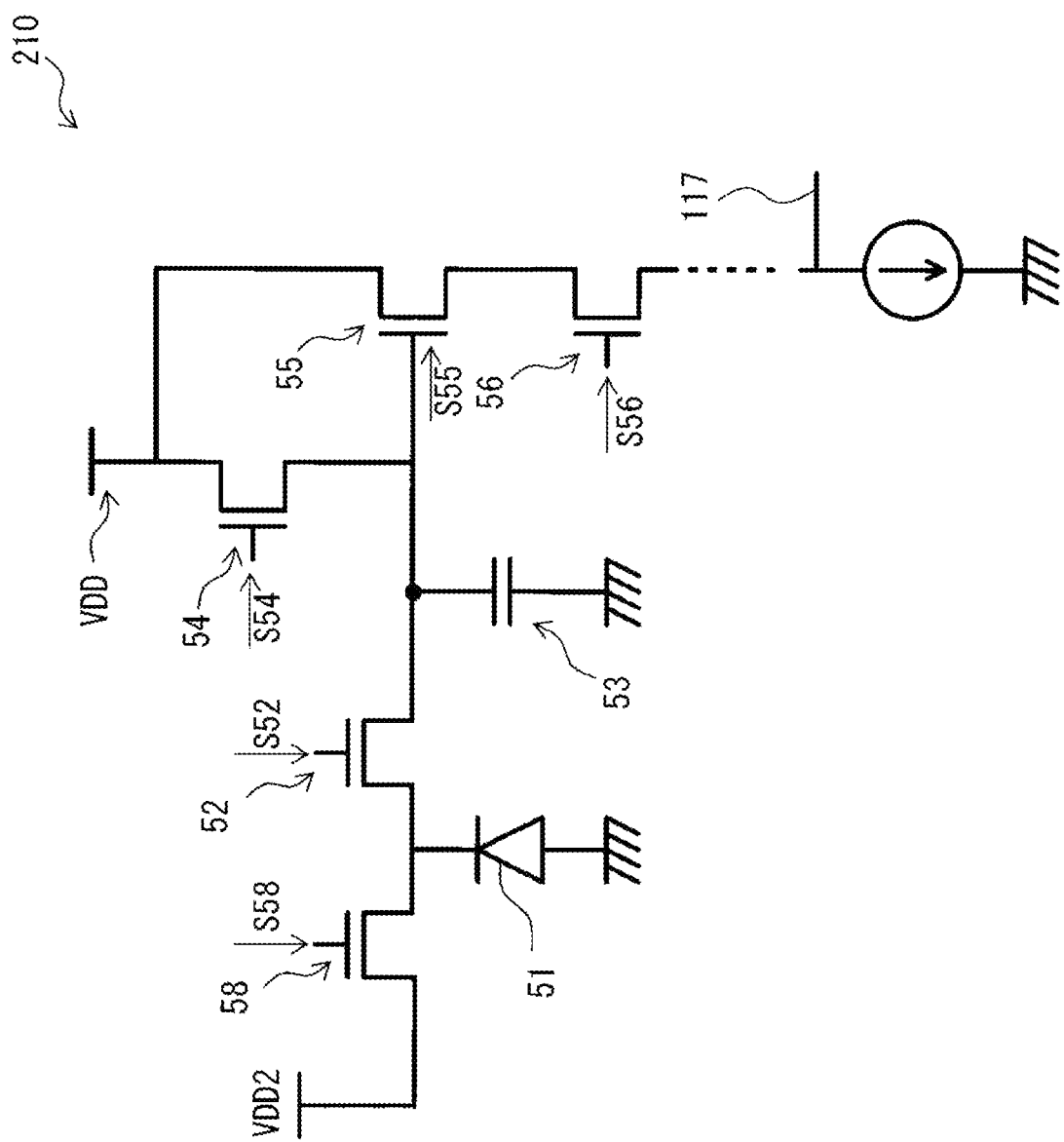
FIG. 9B is a circuit diagram illustrating a circuit configuration of the sensor pixel illustrated in FIG. 9A.

FIG. 9A is a plane configuration example of a sensor pixel 210 according to a second embodiment of the present technology. FIG. 9B is a circuit configuration example of the sensor pixel 210.

The sensor pixel 210 according to the present embodiment is further provided with, as a transfer destination of the electric charges of the PD 51, a VDD2 in addition to the FD 53, and a discharge transistor (OFG) 58 is further provided between the PD 51 and the VDD2. Except for these points, the rest has substantially the same configuration as the sensor pixel 110 according to the first embodiment described above.

The OFG 58 has a drain coupled to the power source VDD2 and a source coupled to a wiring line that couples the TG 52 to the PD 51. The OFG 58 initializes or resets the PD 51 in response to a drive signal S58 applied to a gate electrode thereof. Resetting the PD 51 means depleting the PD 51.

Further, the OFG 58 forms an overflow path between the TG 52 and the power source VDD2, and discharges electric charges overflowing from the PD 51 to the power source VDD2. As described above, in the sensor pixel 210 according to the present embodiment, the OFG 58 is able to directly reset the PD 51, and it is possible to achieve an FD-holding global shutter.

Still further, in the present embodiment, the OFG 58 is also provided with a plurality of trench gates having different depths, i.e., a trench gate 581 and a trench gate 582. Here, a length of the trench gate 581 and a length of the trench gate 582 are different from each other. As described above, in the sensor pixel 210 according to the present embodiment, the OFG 58 has the trench gate 581 and the trench gate 582 having different depths; therefore, it is possible to prevent transfer failure when the electric charges overflowing from the PD 51 are discharged to the power source VDD2.

4. Third Embodiment

Figure 10A:
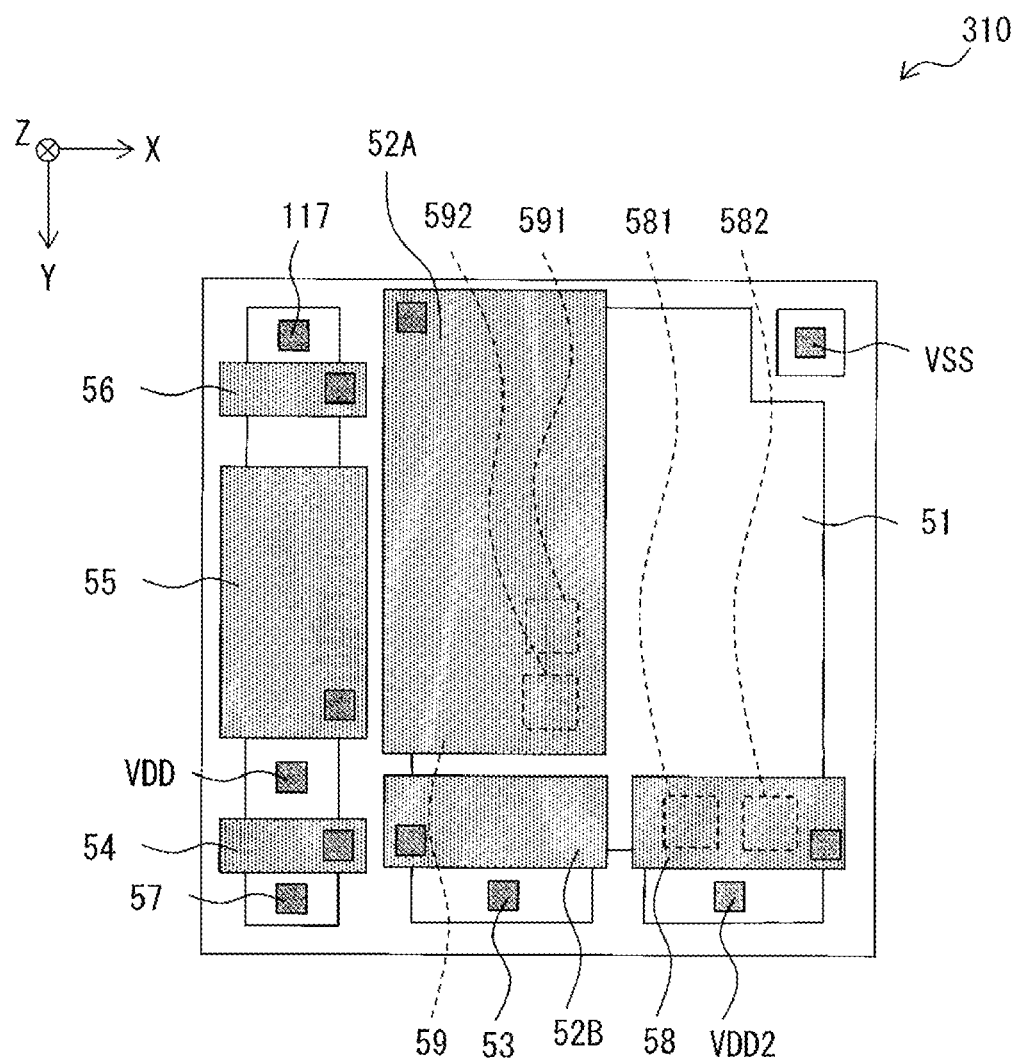
FIG. 10A is a plan view of a sensor pixel according to a third embodiment of the present disclosure.

FIG. 10A is a plane configuration example of a sensor pixel 310 according to a third embodiment of the present technology. FIG. 10B is a circuit configuration example of the sensor pixel 310.

The sensor pixel 310 according to the present embodiment is further provided with an electric charge holding section (MEM) 59 between the PD 51 and the FD 53. Accordingly, instead of the TG 52, a first transfer transistor (TG) 52A and a second transfer transistor (TG) 52B are provided. The TG 52A is disposed between the PD 51 and the MEM 59, and the TG 52B is disposed between the MEM 59 and the FD 53. Except for these points, the rest has substantially the same configuration as the sensor pixel 210 according to the second embodiment described above.

In the sensor pixel 310 according to the present embodiment, by further providing the MEM 59, the electric charges from the PD 51 are transferred to the MEM 59, and it is possible to achieve a memory-holding global shutter. Specifically, in the sensor pixel 310, when a drive signal S52A to be applied to a gate electrode of the TG 52A is turned on to turn on the TG 52A, the electric charges accumulated in the PD 51 are transferred to the MEM 59 via the TG 52A. The MEM 59 is an area that temporarily holds the electric charges accumulated in the PD 51 to achieve the global shutter function. The TG 52B is adapted to transfer the electric charges held in the MEM 59 to the FD 53 in response to a drive signal S52B applied to a gate electrode of the TG 52B. For example, when the drive signal S52 is turned off to turn off the TG 52A, and the drive signal S52B is turned on to turn off the TG 52B, the electric charges held in the MEM 59 are transferred to the FD 53 via the TG 52B.

In the sensor pixel 310 according to the present embodiment, the MEM 59 has the trench gate 591 and the trench gate 592 having different depths. Therefore, it is possible to prevent transfer failure when the electric charges are transferred to the MEM 59 in the PD 51.

5. Fourth Embodiment

Figure 11A:
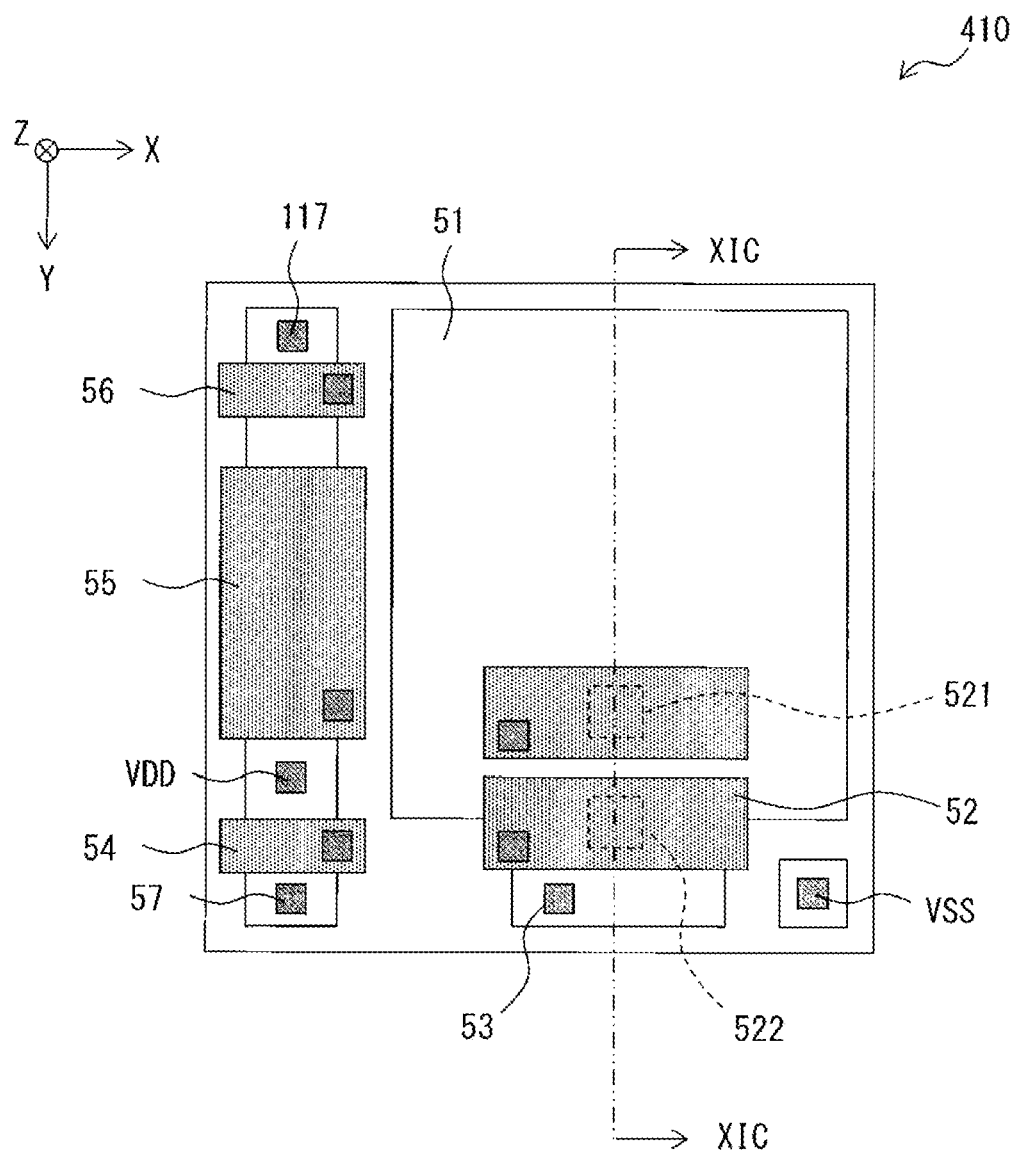
FIG. 11A is a plan view of a sensor pixel according to a fourth embodiment of the present disclosure.
Figure 11B:
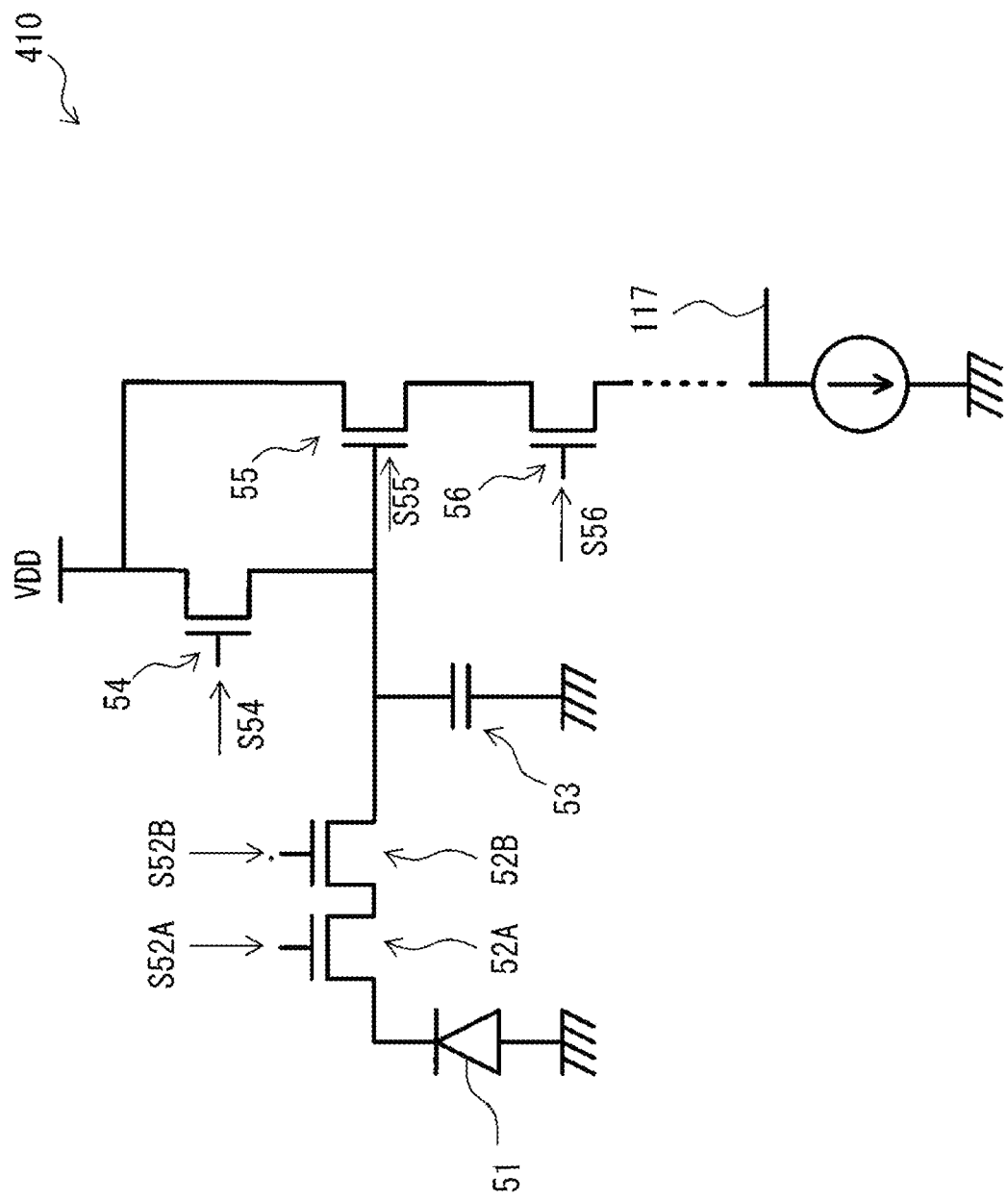
FIG. 11B is a circuit diagram illustrating a circuit configuration of the sensor pixel illustrated in FIG. 11A.

FIG. 11A illustrates a plane configuration example of a sensor pixel 410 according to a fourth embodiment of the present technology. Further, FIG. 11B illustrates a circuit configuration example of the sensor pixel 410. Still further, FIG. 11C illustrates a cross-sectional configuration example of the sensor pixel 410.

Figure 11C:
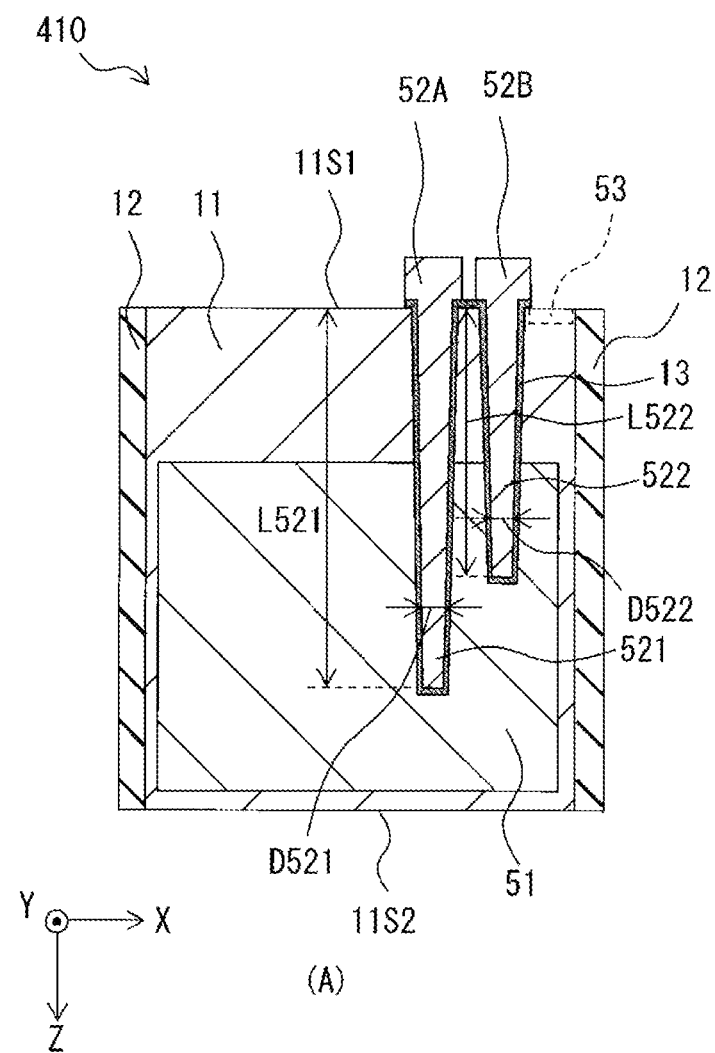
FIG. 11C is a schematic cross-sectional view of a configuration of the sensor pixel illustrated in FIG. 11A.

As illustrated in FIGS. 11A to 11C, in the sensor pixel 410 according to the present embodiment, the transfer section includes a first transfer transistor (TG) 52A and a second transfer transistor (TG) 52B which are configured to be driven independently of each other. The TG 52A includes a trench gate TG 521 and the TG 52B has a trench gate TG 522. Except for these points, the rest has substantially the same configuration as the sensor pixel 110 according to the first embodiment described above. Thus, in the sensor pixel 410, a length L522 of the trench gate 522 is shorter than a length L521 of the trench gate 521 (L521>L522), similar to the sensor pixel 110.

[Workings and Effects of Sensor Pixel 410]

Figure 12A:
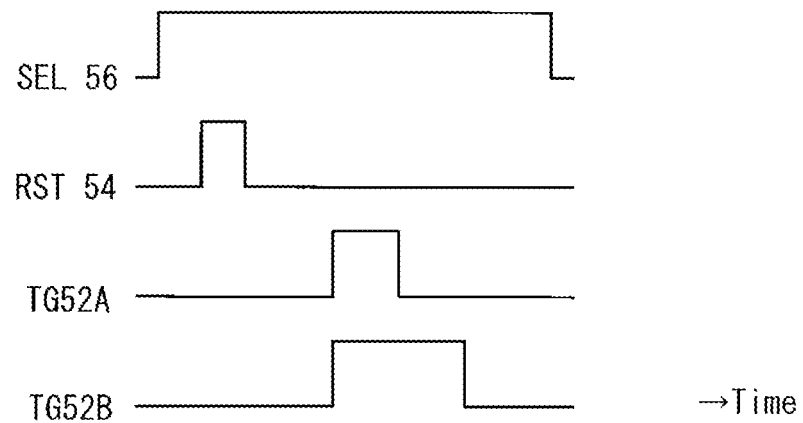
FIG. 12A is a first time chart illustrating waveforms of respective drive signals of the sensor pixel illustrated in FIG. 11A.

In the sensor pixel 410 according to the present embodiment, it is possible to independently drive the TG 52A and the TG 52B; therefore, it is possible to freely select an on/off drive timing in the TG 52A and an on/off drive timing in the TG 52B. Accordingly, as illustrated in FIG. 12A, for example, after simultaneously raising the TG 52A and the TG 52B, i.e., after simultaneously turning on the TG 52A and the TG 52B from the off state, it is possible to lower (turn off from the on state) the TG 52A prior to the TG 52B. As described above, by lowering the TG 52A before the TG 52B, a modulation force that a potential of the PD 51 receives from the TG 52 increases on the way from the back surface 11S2 side to the front surface 11S1 side along the Z-axis direction. As a result, it is possible to more effectively eliminate the potential dip in the PD 51 as compared with the case where two trench gates TG 521 and TG 522 are provided in one TG 52 as in the sensor pixel 110 according to the first embodiment described above.

Figure 12B:
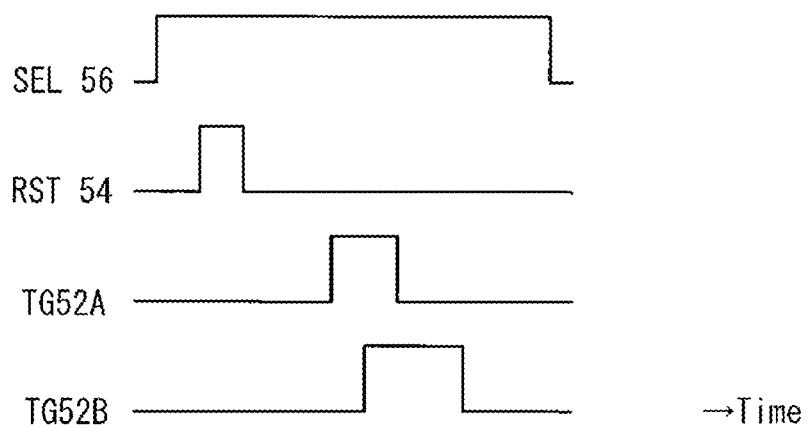
FIG. 12B is a second time chart illustrating waveforms of the respective drive signals of the sensor pixel illustrated in FIG. 11A.
Figure 12C:
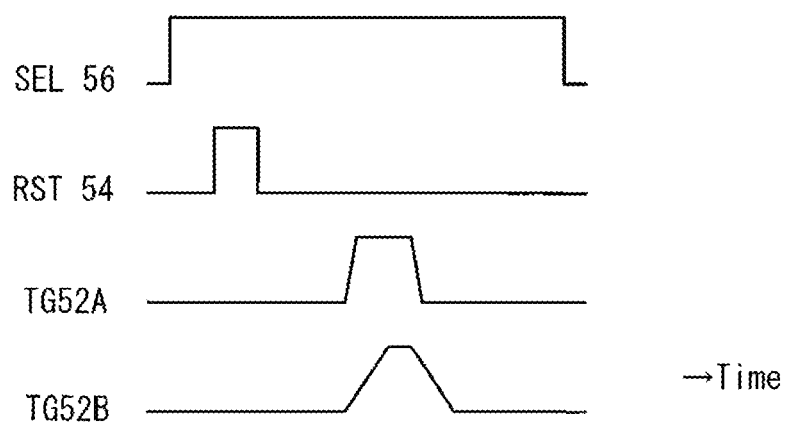
FIG. 12C is a third time chart illustrating waveforms of the respective drive signals of the sensor pixel illustrated in FIG. 11A.

The on/off drive timing in the TG 52A and the on/off driving timing in the TG 52B are not limited to those indicated in FIG. 12A, and may be as indicated in FIG. 12B, for example. FIG. 12B illustrates an example in which the TG 52A is raised before the TG 52B and the TG 52A is lowered before the TG 52B. That is, in the sensor pixel 410 according to the present embodiment, a period of the on state in the TG 52A and a period of the on state in the TG 52B partially overlap with each other, and the TG 52A may be lowered before the TG 52B. Alternatively, as illustrated in FIG. 12C, even if a timing of starting the lowering of the TG 52A coincides with a timing of starting the lowering of the TG 52B, a timing of completing the lowering of the TG 52A may be earlier than a timing of completing the lowering of the TG 52B. That is, by changing a gradient of a rate of switching from the on state to the off state, a timing of completing the switching from the on state to the off state in the TG 52B may be made later than a timing of completing the switching from the on state to the off state in the TG 52A. Pulse waveform rounding indicated in FIG. 12C is achievable by varying a load on the vertical driver 112 or a load on the horizontal driver 114, or by varying a capacitance of the wiring line in the circuit illustrated in FIG. 11B. It is to be noted that FIGS. 12A to 12C are each a time chart indicating waveforms of the respective drive signals supplied to the RST 54, the SEL 56, the TG 52A, and the TG 52B.

6. Modification Examples of Fourth Embodiment (First Modification Example)
[Configuration of Sensor Pixel 410A]

Figure 13A:
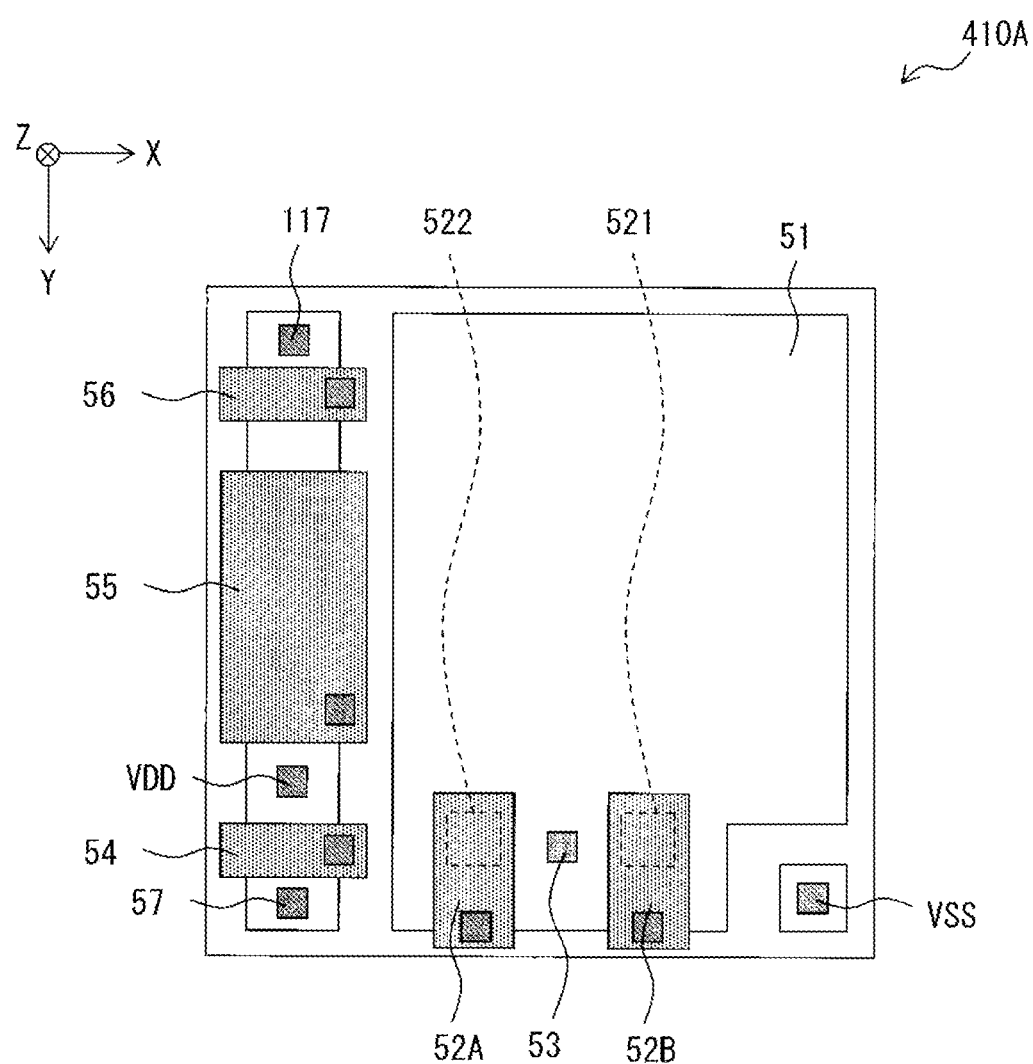
FIG. 13A is a plan view of a sensor pixel according to a first modification example of the fourth embodiment.

FIG. 13A is a plan view of a sensor pixel 410A according to a first modification example of the fourth embodiment. It is to be noted that FIG. 13A corresponds to FIG. 11A of the fourth embodiment.

As illustrated in FIG. 13A, the sensor pixel 410A according to the present modification example is such that the FD 53, which is the transfer destination of the electric charges, is located between the trench gate 521 and the trench gate 522. Except for this point, the rest has substantially the same configuration as the sensor pixel 410 according to the fourth embodiment described above.

[Workings and Effects Sensor Pixel 410A]

As described above, according to the sensor pixel 410A of the present modification example, the FD 53 serving as the transfer destination is disposed between the trench gate 521 and the trench gate 522 as compared with the sensor pixel 410 according to the above-described fourth embodiment. In a portion between the trench gate 521 and the trench gate 522, a back-bias effect is eliminated and the modulation force received from the TG 52A and the TG 52B is the highest. Accordingly, the electric charges to be transferred inevitably pass between the trench gate 521 and the trench gate 522 to be transferred to the front surface 11S1. The presence of the FD 53, which is the transfer destination of the electric charges, in the vicinity of the front surface 11S enhances a transfer efficiency of the electric charges from the PD 51 to the FD 53.

(Second Modification Example)
[Configuration of Sensor Pixel 410B]

Figure 13B:
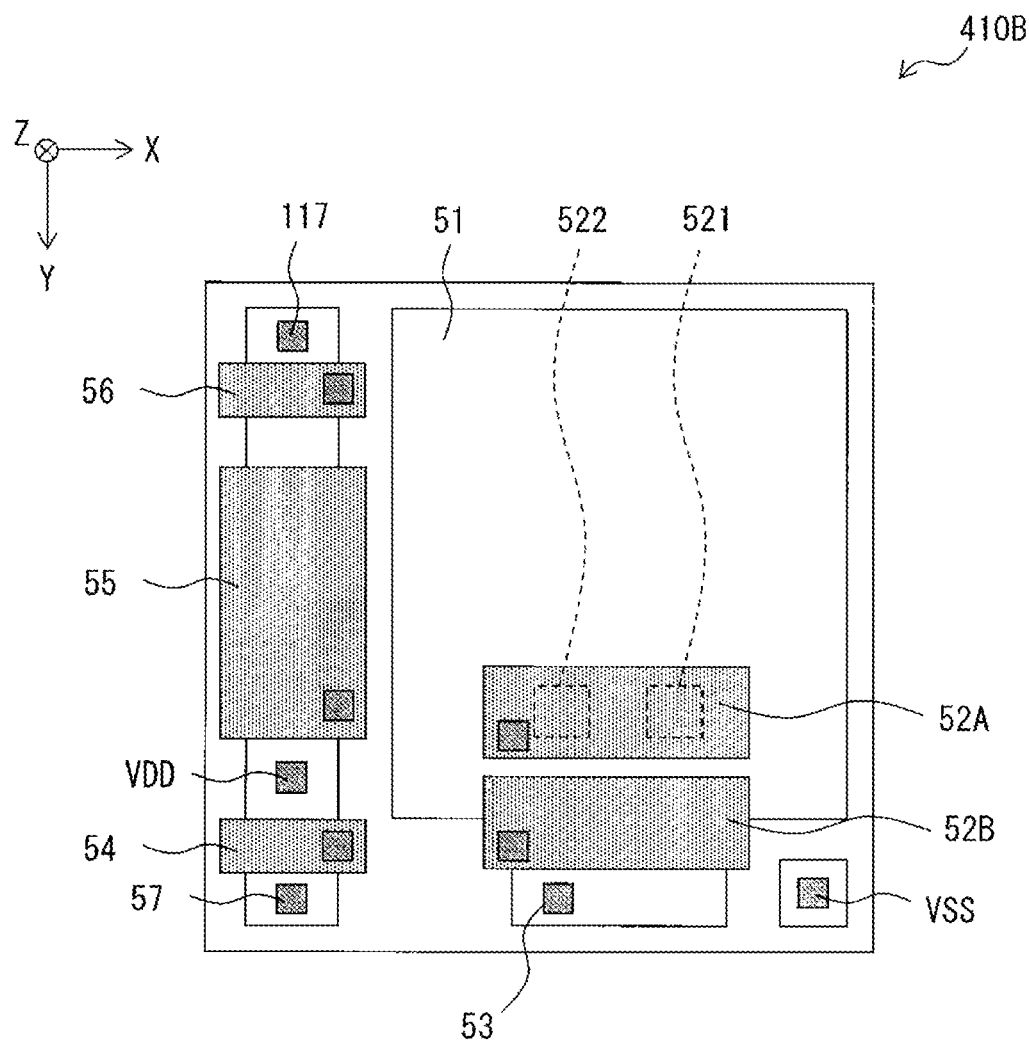
FIG. 13B is a plan view of a sensor pixel according to a second modification example of the fourth embodiment.

FIG. 13B is a plan view of a sensor pixel 410B according to a second modification example of the fourth embodiment. It is to be noted that FIG. 13B corresponds to FIG. 11A of the fourth embodiment.

As illustrated in FIG. 13B, in the sensor pixel 410B according to the present modification example, the TG 52A includes both of the trench gate 521 and the trench gate 522. The TG 52B does not have a trench gate, and is located between the TG 52A and the FD 53, which is the transfer destination of the electric charges. Except for this point, the rest has substantially the same configuration as the sensor pixel 410 according to the fourth embodiment described above.

[Workings and Effects Sensor Pixel 410B]

Thus, according to the sensor pixel 410B according to the present modification example, the TG 52B having no trench gate is provided between the TG 52A having two trench gates 521 and 522 and the FD 53. Accordingly, it is possible to eliminate the potential dip in the PD 51 while suppressing the modulation force that the potential of the PD 51 receives from the trench gates 521 and 522 of the TG 52A to an appropriate level. As in the sensor pixel 410 illustrated in FIG. 11A and the like, in a case where the TG 52B close to the FD 53, which is the transfer destination of the electric charges, has a trench gate, the modulation force of the trench gate on the potential of the PD 51 may become excessively high. In such a case, when the TG 52B is switched from the on state to the off state, electrons may move from the FD 53 toward the trench gate. The sensor pixel 410B of the present modification example is able to effectively prevent such a backflow of electrons.

(Third Modification Example)
[Configuration of Sensor Pixel 410C]

Figure 13C:
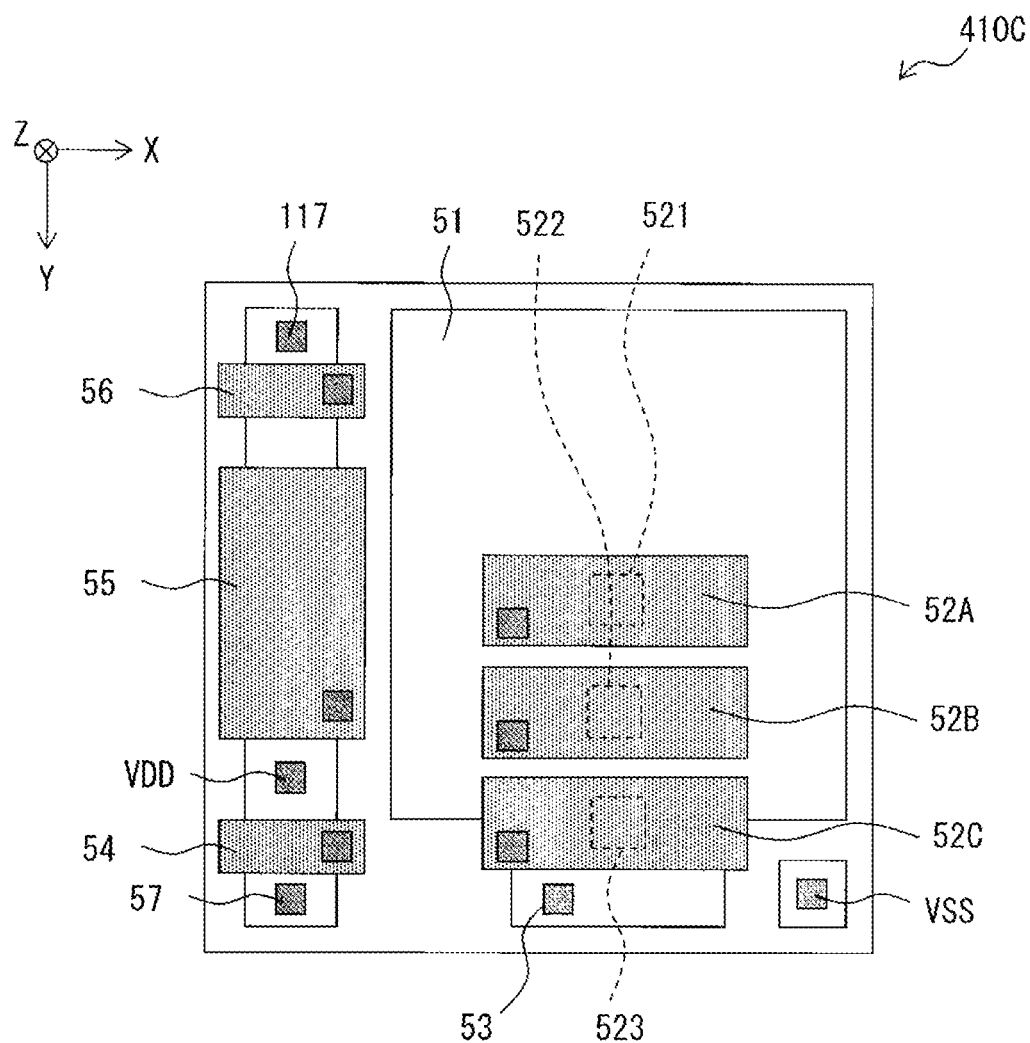
FIG. 13C is a plan view of a sensor pixel according to a third modification example of the fourth embodiment.

FIG. 13C is a plan view of a sensor pixel 410C according to a third modification example of the fourth embodiment. It is to be noted that FIG. 13C corresponds to FIG. 11A of the fourth embodiment.

As shown in FIG. 13C, the sensor pixel 410C according to the present modification example further includes a TG 52C which is configured to be driven independently with respect to the TG 52A and the TG 52B as a transfer section. The TG 52A includes the trench gate 521, the TG 52B includes the trench gate 522, and the TG 52C includes a trench gate 523. Except for this point, the rest has substantially the same configuration as the sensor pixel 410 according to the fourth embodiment described above.

[Workings and Effects Sensor Pixel 410C]

As described above, according to the sensor pixel 410C of the present modification example, the TG 52C is further provided; therefore, it is possible to more smoothly transfer the electric charges from the PD 51 in the horizontal plane (XY plane) as compared with the sensor pixel 410. Accordingly, for example, it is possible to easily increase a saturated signal amount of the PD 51.

(Fourth Modification Example)
[Configuration of Sensor Pixel 410D]

Figure 13D:
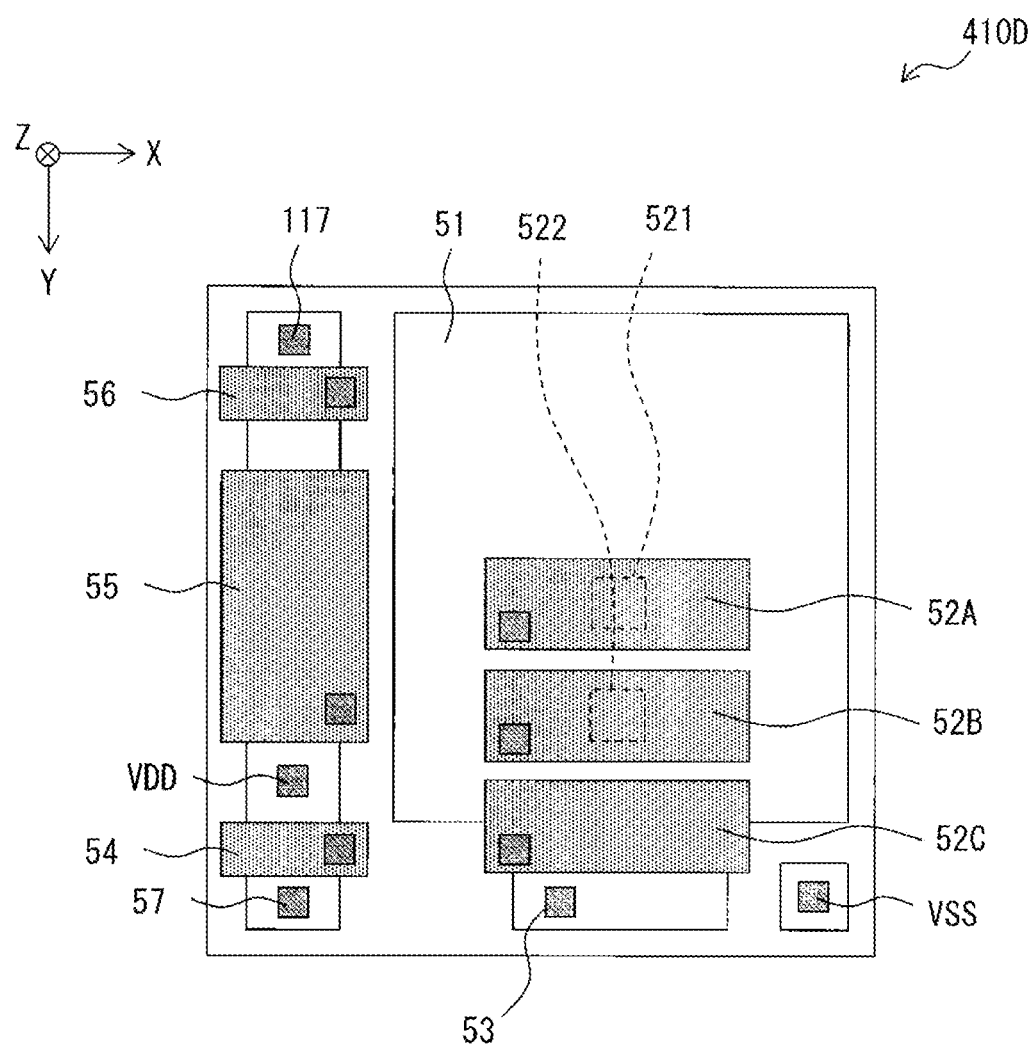
FIG. 13D is a plan view of a sensor pixel according to a fourth modification example of the fourth embodiment.

FIG. 13D is a plan view of a sensor pixel 410D according to a fourth modification example of the fourth embodiment. It is to be noted that FIG. 13D corresponds to FIG. 11A of the fourth embodiment.

As illustrated in FIG. 13D, in the sensor pixel 410D according to the present modification example, the TG 52C has no trench gate. Except for this point, the rest has substantially the same configuration as the sensor pixel 410C according to the third modification example of the fourth embodiment described above.

[Workings and Effects Sensor Pixel 410D]

Thus, according to the sensor pixel 410D of the present modification example, the TG 52C having no trench gate is provided between the TG 52A and the TG 52B and the FD 53 having the trench gates 521 and 522, respectively. Accordingly, it is possible to eliminate the potential dip in the PD 51 while suppressing the modulation force that the potential of the PD 51 receives from each of the trench gate 521 of the TG 52A and the trench gate 522 of the TG 52B to an appropriate level.

7. Example of Application to Electronic Apparatus

Figure 14:
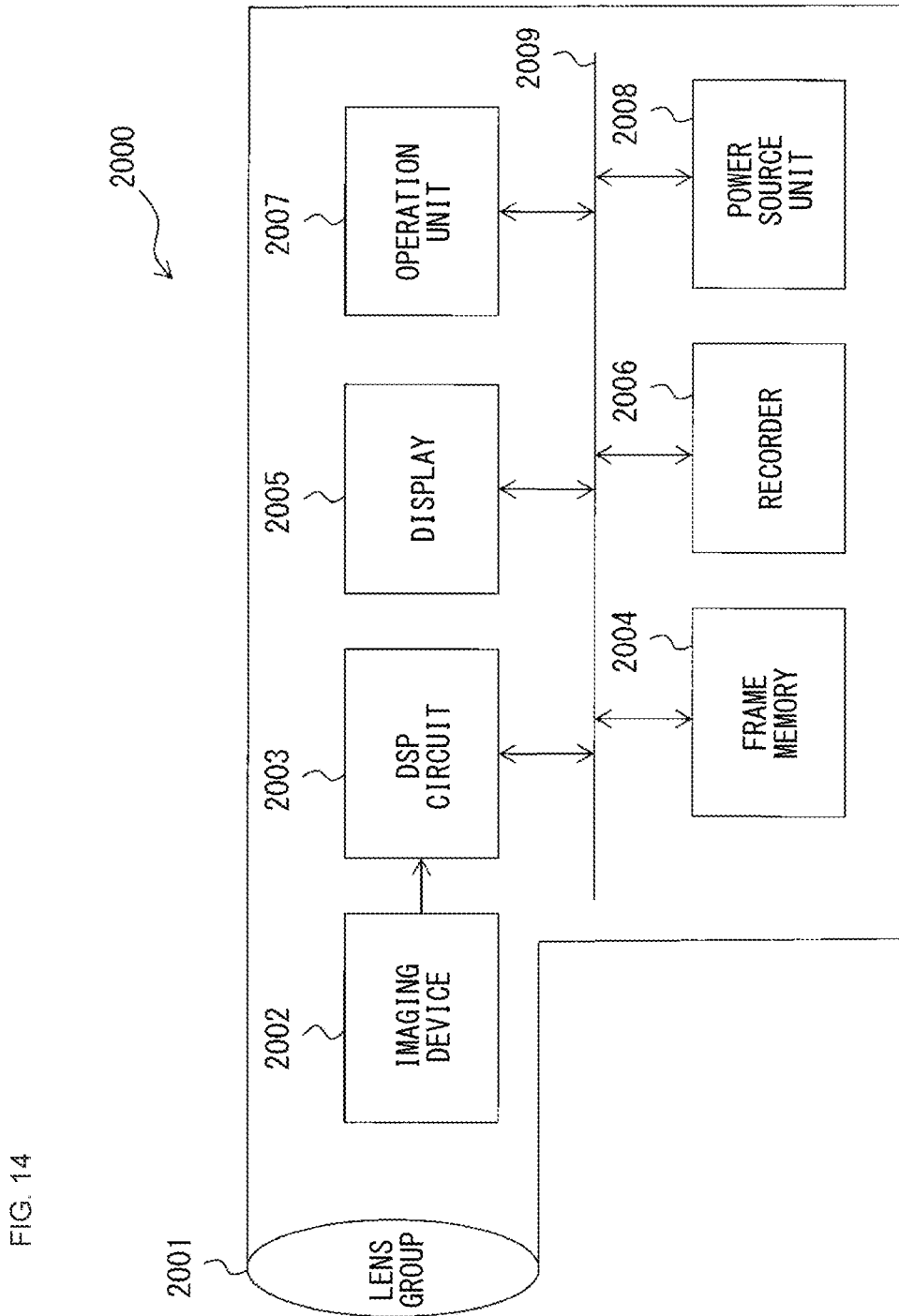
FIG. 14 is a schematic diagram illustrating an overall configuration example of an electronic apparatus.

FIG. 14 is a block diagram illustrating a configuration example of a camera 2000 which is an electronic apparatus to which the present technology is applied.

The camera 2000 includes: an optical unit 2001 including a lens group, etc.; an imaging device 2002 to which the above-described solid-state imaging device 101 or the like (hereinafter referred to as the solid-state imaging device 101 or the like) is applied; and a DSP (Digital Signal Processor) circuit 2003 which is a camera signal processing circuit. The camera 2000 also includes a frame memory 2004, a display 2005, a recorder 2006, an operation unit 2007, and a power source unit 2008. The DSP circuit 2003, the frame memory 2004, the display 2005, the recorder 2006, the operation unit 2007, and the power source unit 2008 are coupled to each other via a bus line 2009.

The optical unit 2001 takes in entering light (image light) from a subject and forms an image on an imaging plane of the imaging device 2002. The imaging device 2002 converts a light amount of the entering light, which is formed into the image on the imaging plane by the optical unit 2001, to an electric signal on a pixel-unit basis, and outputs the electric signal as a pixel signal.

The display 2005 includes, for example, a panel display device such as a liquid crystal panel or an organic EL panel. The display 2005 displays, for example, a moving image or a still image captured by the imaging device 2002. The recorder 2006 causes the moving image or the still image captured by the imaging device 2002 to be recorded in a recording medium such as a hard disk or a semiconductor memory.

The operation unit 2007 outputs an operation command regarding a variety of functions of the camera 2000 under operation by a user. The power source unit 2008 appropriately supplies a variety of power sources to serve as respective operation power sources for the DSP circuit 2003, the frame memory 2004, the display 2005, the recorder 2006, and the operation unit 2007, to these targets of supply.

As described above, the use of the above-described solid-state imaging device 101A or the like as the imaging device 2002 leads to an expectation of acquiring a favorable image.

8. Example of Practical Application to Mobile Body

The technology according to the present disclosure (present technology) is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, and the like.

Figure 15:
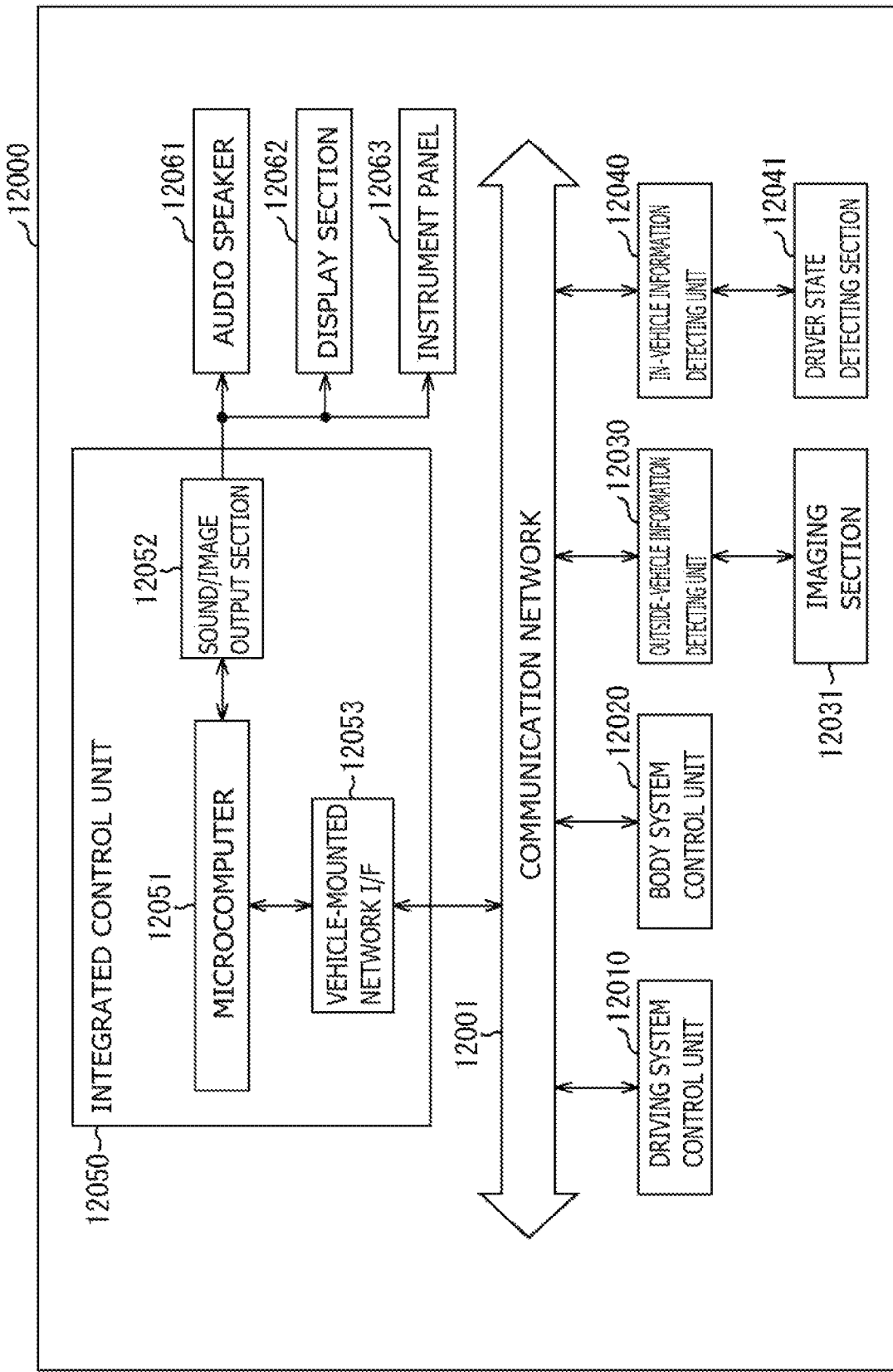
FIG. 15 is a block diagram depicting an example of schematic configuration of a vehicle control system.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

Figure 16:
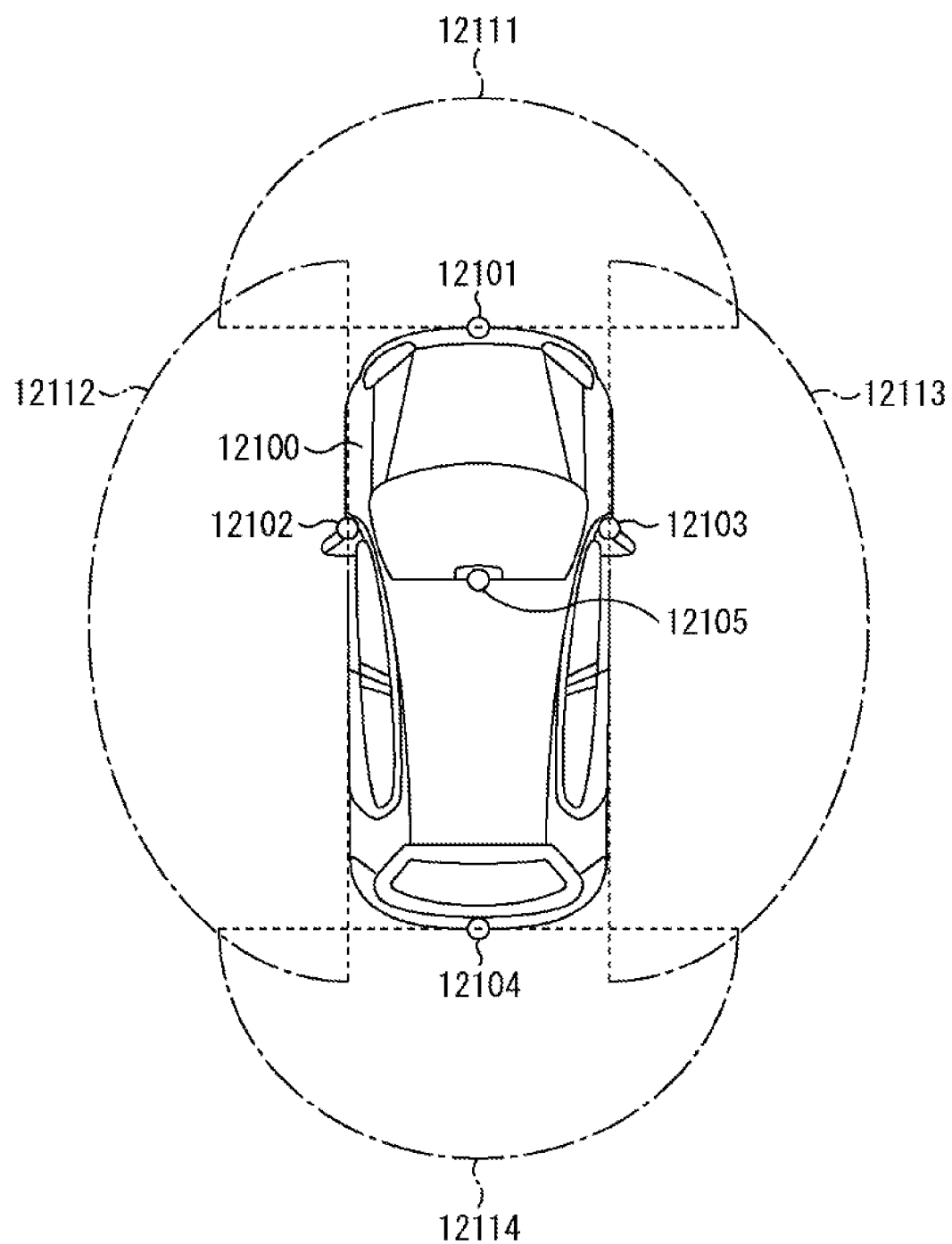
FIG. 16 is a diagram of assistance in explaining an example of installation positions of an outside-vehicle information detecting section and an imaging section.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, described is one example of the vehicle control system to which the technology according to the present disclosure is applicable. The technology according to the present disclosure is applicable to the imaging section 12031 among the above-described components. Specifically, the solid-state imaging device 101A illustrated in FIG. 1, etc. or the like is applicable to the imaging section 12031. The application of the technology according to the present disclosure to the imaging section 12031 leads to an expectation of a superior operation of the vehicle control system.

9. Example of Practical Application to Endoscopic Surgery System

The technology (the present technology) according to the present disclosure is applicable to a variety of products. For example, the technology according to the present disclosure may be applied to an endoscopic surgery system.

Figure 17:
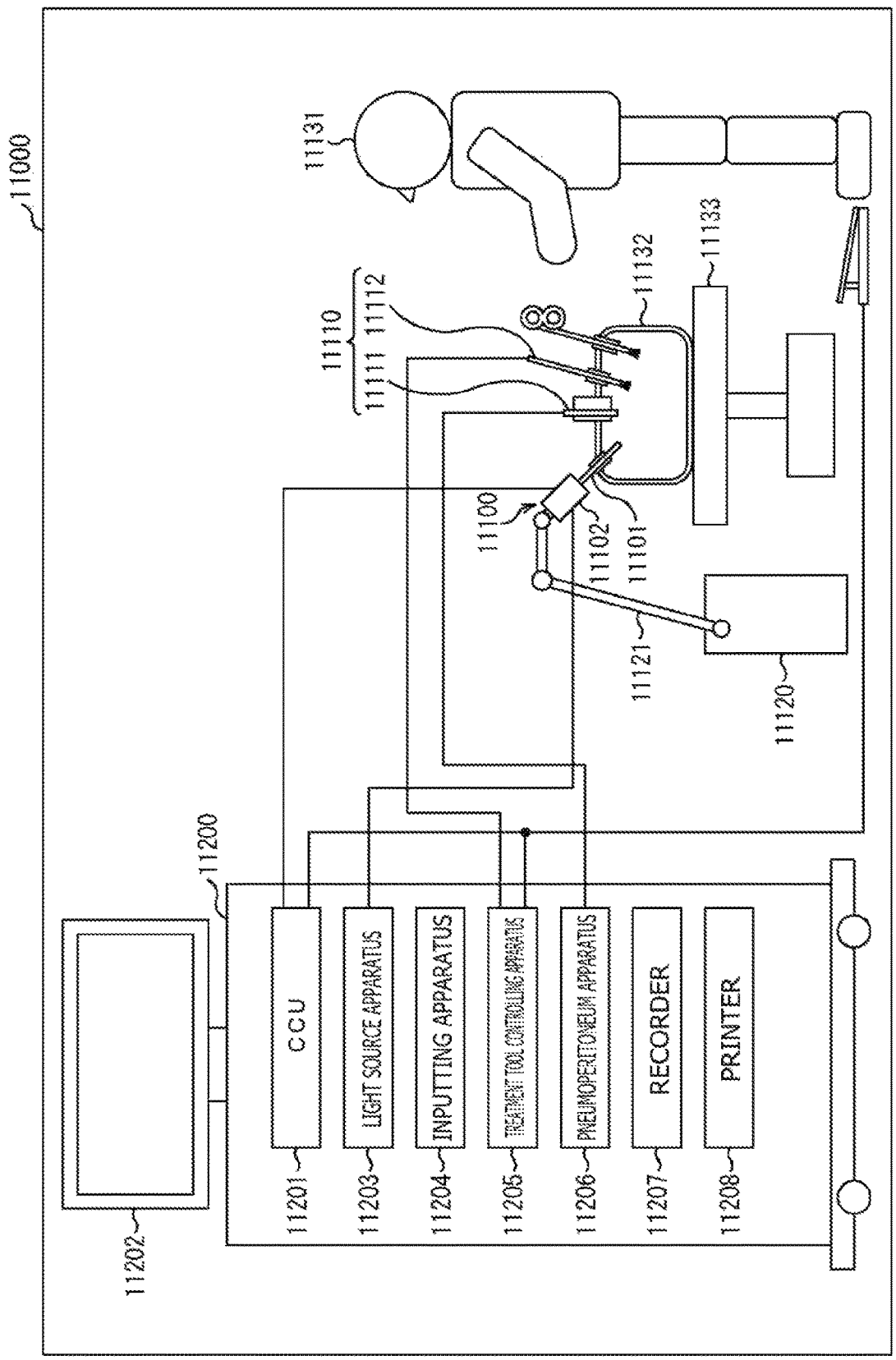
FIG. 17 is a view depicting an example of a schematic configuration of an endoscopic surgery system.

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 18:
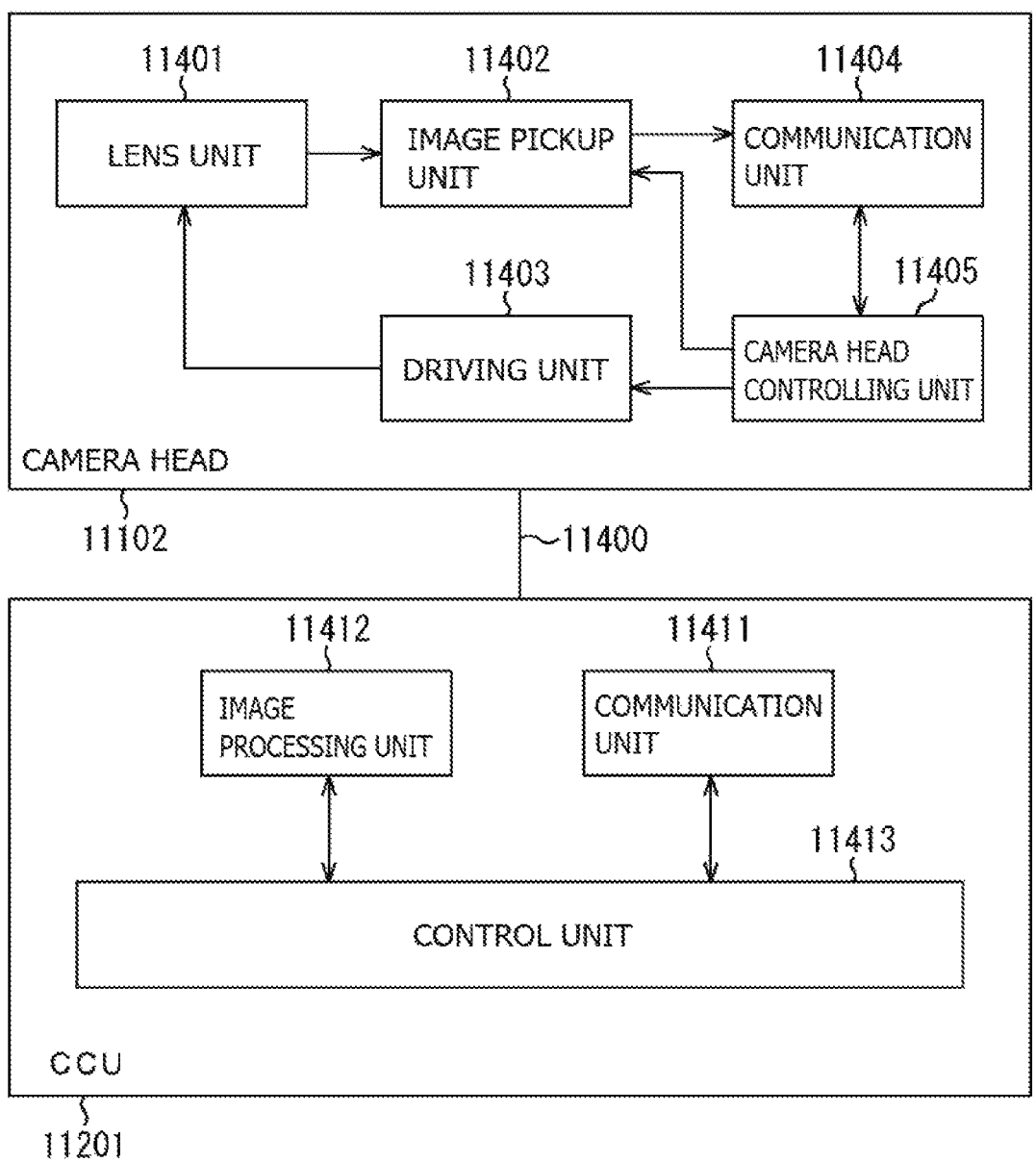
FIG. 18 is a block diagram depicting an example of a functional configuration of a camera head and a camera control unit (CCU).

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to (the image processing unit 11412 of) the CCU 11201 or the like among the above-described components. Specifically, for example, the solid-state imaging device 101A of FIG. 1A may be applied to the image pickup unit 10402. Applying the technology according to the present disclosure to the image pickup unit 10402 enables to acquire a clearer image of the surgical region and thereby making it possible for the surgeon to confirm the surgical region with certainty.

It is to be noted that the endoscopic surgery system has been described here as an example, but the technology according to the present disclosure may be additionally applied, for example, to a microscopic surgery system or the like.

10. Other Modification Examples

Although the present disclosure has been described with reference to some embodiments and modification examples, the present disclosure is not limited to the above embodiments and the like, and may be modified in a variety of ways. For example, in the above embodiments and the like, the global shutter mode backside illumination image sensor has been exemplified, but the imaging device according to the present disclosure is not limited thereto, and may be an image sensor of another type. That is, the present disclosure is not limited to the global shutter mode image sensor, and is also applicable to a rolling shutter image sensor. Further, the present disclosure is not limited to the backside illumination image sensor, and is also applicable to a front-side illumination image sensor. In addition, the technique of the present disclosure is not limited to the application to the CMOS image sensors, and is applicable to every solid-state imaging device of an X-Y addressing method in which unit pixels are arranged two-dimensionally in a matrix.

Further, the imaging device according to the present disclosure is not limited to the imaging device that detects a light amount distribution of visible light and acquires the light amount distribution as an image, and may be an imaging device that acquires a distribution of an amount of entering infrared rays, X-rays, particles, or the like as an image.

Further, the imaging device according to the present disclosure may be in a form of a module in which the imaging section and the signal processor or the optical system are packaged together.

In the above embodiments and the like, the sensor pixels each including, as the transfer sections, two or three transfer transistors separated from each other are exemplified, but the imaging device according to the present disclosure may have four or more transfer transistors as the transfer sections.

It is to be noted that the effects described herein are merely examples, but not limitative. In addition, there may be other effects. Further, the present disclosure may have the following configurations.

(1)

An imaging device including:

a semiconductor layer having a front surface and a back surface, the back surface being on an opposite side of the front surface;

a photoelectric converter that is embedded in the semiconductor layer and generates electric charges corresponding to a received light amount; and a transfer section that includes a first trench gate and a second trench gate and transfers the electric charges from the photoelectric converter to a single transfer destination via the first trench gate and the second trench gate, the first trench gate and the second trench gate each extending from the front surface to the back surface of the semiconductor layer into the photoelectric converter, in which the first trench gate has a first length from the front surface to the photoelectric converter, and the second trench gate has a second length from the front surface to the photoelectric converter, the second length being shorter than the first length.

(2)

The imaging device according to (1), in which the transfer destination is an electric charge-voltage converter.

(3)

The imaging device according to (1), in which the transfer destination is an electric charge holding section.

(4)

The imaging device according to (1), in which the transfer destination is a power source.

(5)

The imaging device according to (1), in which the transfer destination is located between the first trench gate and the second trench gate.

(6)

The imaging device according to any one of (1) to (5), in which, in a plane parallel to the front surface, a distance between the second trench gate and the transfer destination is shorter than a distance between the first trench gate and the transfer destination.

(7)

The imaging device according to any one of (1) to (6), in which the transfer section includes a first transistor and a second transistor, the first transistor and the second transistor being configured to be driven independently of each other.

(8)

The imaging device according to (7), in which the first transistor includes the first trench gate, and the second transistor includes the second trench gate.

(9)

The imaging device according to (7), in which the first transistor includes the first trench gate and the second trench gate, and the second transistor is located between the first transistor and the transfer destination.

(10)

The imaging device according to (7), further including a controller that turns the first transistor which is in an on state into an off state and thereafter turns the second transistor which is in the on state into the off state.

(11)

The imaging device according to (1), in which the transfer section includes one transistor, the one transistor includes the first trench gate, the second trench gate, and a third trench gate, and in a plane parallel to the front surface, a second distance between the second trench gate and the transfer destination is shorter than a first distance between the first trench gate and the transfer destination, and a third distance between the third trench gate and the transfer destination is shorter than the first distance.

(12)

The imaging device according to (1), in which the transfer section includes one transistor, the one transistor includes the first trench gate, the second trench gate, and a third trench gate, and in a plane parallel to the front surface, a second distance between the second trench gate and the transfer destination is shorter than a first distance between the first trench gate and the transfer destination, and a third distance between the third trench gate and the transfer destination is longer than the second distance.

(13)

The imaging device according to any one of (1) to (12), in which a maximum diameter of the first trench gate is larger than a maximum diameter of the second trench gate.

(14)

The imaging device according to any one of (1) to (12), in which a diameter of the first trench gate and a diameter of the first trench gate each have a portion that is narrowed toward the back surface from the front surface.

(15)

An electronic apparatus including an imaging device, the imaging device including:

a semiconductor layer having a front surface and a back surface, the back surface being on an opposite side of the front surface;

a photoelectric converter that is embedded in the semiconductor layer and generates electric charges corresponding to a received light amount; and a transfer section that includes a first trench gate and a second trench gate and transfers the electric charges from the photoelectric converter to a single transfer destination via the first trench gate and the second trench gate, the first trench gate and the second trench gate each extending from the front surface to the back surface of the semiconductor layer into the photoelectric converter, in which the first trench gate has a first length from the front surface to the photoelectric converter, and the second trench gate has a second length from the front surface to the photoelectric converter, the second length being shorter than the first length.

This application claims the benefit of Japanese Priority Patent Application JP2018-143491 filed with the Japan Patent Office on Jul. 31, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and
wherein the transfer destination is an electric charge holding section.

2. An electronic apparatus comprising the imaging device of claim 1.

3. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and
wherein the transfer destination is a power source.

4. An electronic apparatus comprising the imaging device of claim 3.

5. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and
wherein the transfer destination is located between the first trench gate and the second trench gate.

6. An electronic apparatus comprising the imaging device of claim 5.

7. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and wherein, in a plane parallel to the front surface, a distance between the second trench gate and the transfer destination is shorter than a distance between the first trench gate and the transfer destination.

8. An electronic apparatus comprising the imaging device of claim 7.

9. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and
wherein the transfer section includes a first transistor and a second transistor, the first transistor and the second transistor being configured to be driven independently of each other.

10. The imaging device according to claim 9, wherein the first transistor includes the first trench gate, and the second transistor includes the second trench gate.

11. The imaging device according to claim 9, wherein the first transistor includes the first trench gate and the second trench gate, and
the second transistor is located between the first transistor and the transfer destination.

12. The imaging device according to claim 9, further comprising
a controller that turns the first transistor which is in an on state into an off state and thereafter turns the second transistor which is in the on state into the off state.

13. An electronic apparatus comprising the imaging device of claim 9.

14. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length,
wherein the transfer section includes one transistor,
wherein the one transistor includes the first trench gate, the second trench gate, and a third trench gate, and
wherein, in a plane parallel to the front surface, a second distance between the second trench gate and the transfer destination is shorter than a first distance between the first trench gate and the transfer destination, and a third distance between the third trench gate and the transfer destination is shorter than the first distance.

15. An electronic apparatus comprising the imaging device of claim 14.

16. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length,
wherein the transfer section includes one transistor,
wherein the one transistor includes the first trench gate, the second trench gate, and a third trench gate, and
wherein, in a plane parallel to the front surface, a second distance between the second trench gate and the transfer destination is shorter than a first distance between the first trench gate and the transfer destination, and a third distance between the third trench gate and the transfer destination is longer than the second distance.

17. An electronic apparatus comprising the imaging device of claim 16.

18. An imaging device, comprising:
a semiconductor layer having a front surface and a back surface, the back surface being on an opposite side of the semiconductor layer from the front surface;
a photoelectric converter that is embedded in the semiconductor layer and that generates electric charges corresponding to a received light amount; and
a transfer section that includes a first trench gate and a second trench gate and that transfers the electric charges from the photoelectric converter to a single transfer destination via the first trench gate and the second trench gate, the first trench gate and the second trench gate each extending from the front surface toward the back surface of the semiconductor layer and into the photoelectric converter,
wherein the first trench gate has a first length from the front surface to the photoelectric converter,
wherein the second trench gate has a second length from the front surface to the photoelectric converter, the second length being shorter than the first length, and wherein a maximum diameter of the first trench gate is larger than a maximum diameter of the second trench gate.

19. An electronic apparatus comprising the imaging device of claim 18.

\* \* \* \* \*